US012255164B2

(12) United States Patent
Chen et al.

(10) Patent No.: US 12,255,164 B2
(45) Date of Patent: Mar. 18, 2025

(54) STRUCTURE AND METHOD FOR ISOLATION OF BIT-LINE DRIVERS FOR A THREE-DIMENSIONAL NAND

(71) Applicant: Yangtze Memory Technologies Co., Ltd., Hubei (CN)

(72) Inventors: Liang Chen, Hubei (CN); Wei Liu, Hubei (CN); Cheng Gan, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/850,276

(22) Filed: Jun. 27, 2022

(65) Prior Publication Data

US 2022/0328441 A1   Oct. 13, 2022

Related U.S. Application Data

(60) Division of application No. 16/729,821, filed on Dec. 30, 2019, now Pat. No. 11,538,780, which is a
(Continued)

(51) Int. Cl.
*H01L 23/00* (2006.01)
*H01L 21/3105* (2006.01)
(Continued)

(52) U.S. Cl.
CPC ........ *H01L 24/08* (2013.01); *H01L 21/31053* (2013.01); *H01L 21/76224* (2013.01);
(Continued)

(58) Field of Classification Search
CPC ......... H01L 21/76224–76237; H01L 29/0649; H01L 27/11273; H01L 27/1128;
(Continued)

(56) References Cited

U.S. PATENT DOCUMENTS

| 5,356,821 A | 10/1994 | Naruse et al. |
| 2004/0019871 A1* | 1/2004 | Morita .................... G06F 30/39 |
| | | 716/55 |

(Continued)

FOREIGN PATENT DOCUMENTS

| CN | 108428709 A | 8/2018 |
| CN | 109037224 A | 12/2018 |

(Continued)

OTHER PUBLICATIONS

English of Translation of CN 10937224 Translation conducted on Oct. 7, 2023.*

(Continued)

*Primary Examiner* — Amar Movva
(74) *Attorney, Agent, or Firm* — HANLEY, FLIGHT & ZIMMERMAN, LLC

(57) ABSTRACT

Embodiments of a three-dimensional (3D) memory device and fabrication methods are disclosed. In some embodiments, the 3D memory device includes a peripheral circuitry formed on a first substrate. The peripheral circuitry includes a plurality of peripheral devices on a first side of the first substrate, a first interconnect layer, and a deep-trench-isolation on a second side of the first substrate, wherein the first and second sides are opposite sides of the first substrate and the deep-trench-isolation is configured to provide electrical isolation between at least two neighboring peripheral devices. The 3D memory device also includes a memory array formed on a second substrate. The memory array includes at least one memory cell and a second interconnect layer, wherein the second interconnect layer of the memory array is bonded with the first interconnect layer of the peripheral circuitry, and the peripheral devices are electrically connected with the memory cells.

20 Claims, 16 Drawing Sheets

Related U.S. Application Data continuation of application No. PCT/CN2019/110978, filed on Oct. 14, 2019.

(51) Int. Cl.

| | |
|---|---|
| *H01L 21/762* | (2006.01) |
| *H01L 23/522* | (2006.01) |
| *H01L 23/528* | (2006.01) |
| *H01L 25/18* | (2023.01) |
| *H10B 43/27* | (2023.01) |
| *H10B 43/40* | (2023.01) |

(52) U.S. Cl.
CPC ............ *H01L 23/528* (2013.01); *H01L 24/50* (2013.01); *H01L 24/89* (2013.01); *H01L 25/18* (2013.01); *H10B 43/27* (2023.02); *H10B 43/40* (2023.02); *H01L 23/5226* (2013.01); *H01L 2224/08145* (2013.01); *H01L 2224/08146* (2013.01); *H01L 2224/08147* (2013.01); *H01L 2224/80001* (2013.01); *H01L 2924/14511* (2013.01)

(58) Field of Classification Search
CPC ......... H01L 27/11514; H01L 27/11551; H01L 27/11553; H01L 27/11556; H01L 27/11578; H01L 27/1158; H01L 27/11582; H01L 27/11597; H10B 20/40; H10B 20/50; H10B 53/20; H10B 41/20; H10B 41/23; H10B 41/27; H10B 43/20; H10B 43/23; H10B 43/27; H10B 51/50
See application file for complete search history.

(56) References Cited

U.S. PATENT DOCUMENTS

| | | | |
|---|---|---|---|
| 2009/0174027 A1* | 7/2009 | Tilke | ................ H01L 21/76224 257/E21.546 |
| 2014/0061804 A1 | 3/2014 | Kamoshita | |
| 2016/0064533 A1 | 3/2016 | Owada | |
| 2016/0079250 A1 | 3/2016 | Akutsu et al. | |
| 2019/0221557 A1 | 7/2019 | Kim et al. | |
| 2020/0058669 A1* | 2/2020 | Chen | ..................... H10B 43/27 |
| 2020/0105780 A1 | 4/2020 | Lai et al. | |
| 2021/0111137 A1 | 4/2021 | Chen et al. | |
| 2023/0078865 A1 | 3/2023 | Chen et al. | |

FOREIGN PATENT DOCUMENTS

| | | |
|---|---|---|
| CN | 109155320 A | 1/2019 |
| KR | 10-2016-0017623 A | 2/2016 |
| TW | 201916323 A | 4/2019 |
| TW | 202027180 A | 7/2020 |
| WO | WO 2019/052127 A1 | 3/2019 |

OTHER PUBLICATIONS

Kitamura et al., "Suppression of crosstalk by using backside deep trench isolation for 1.12μm backside illuminated CMOS image sensor," 2012 International Electron Devices Meeting, Dec. 10, 2012; 4 pages.

International Search Report and Written Opinion of the International Searching Authority directed to related International Patent Application No. PCT/CN2019/110978, mailed Jun. 29, 2020; 6 pages.

* cited by examiner

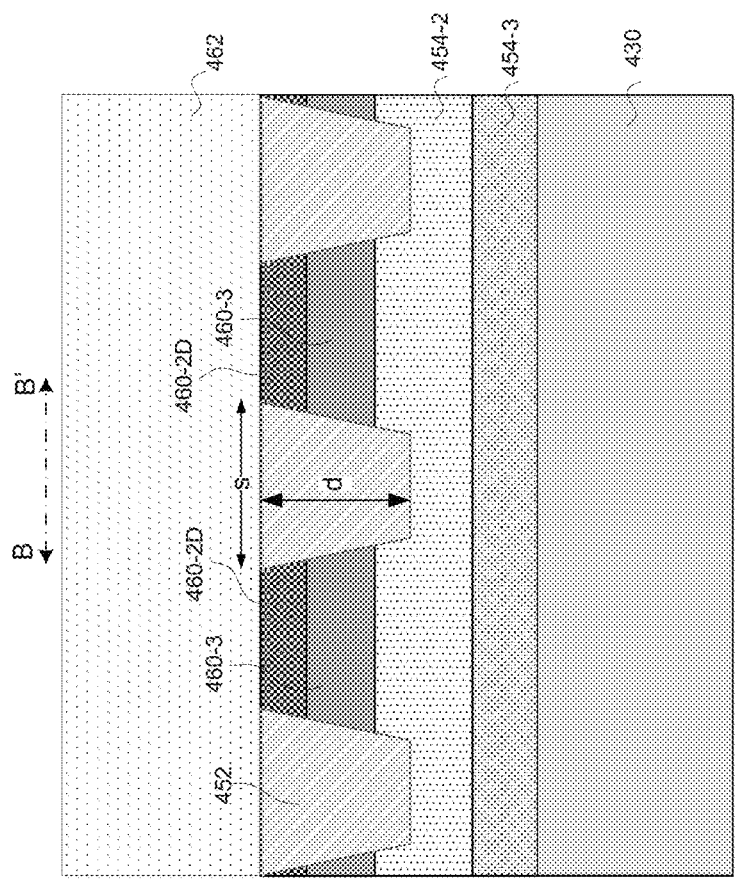
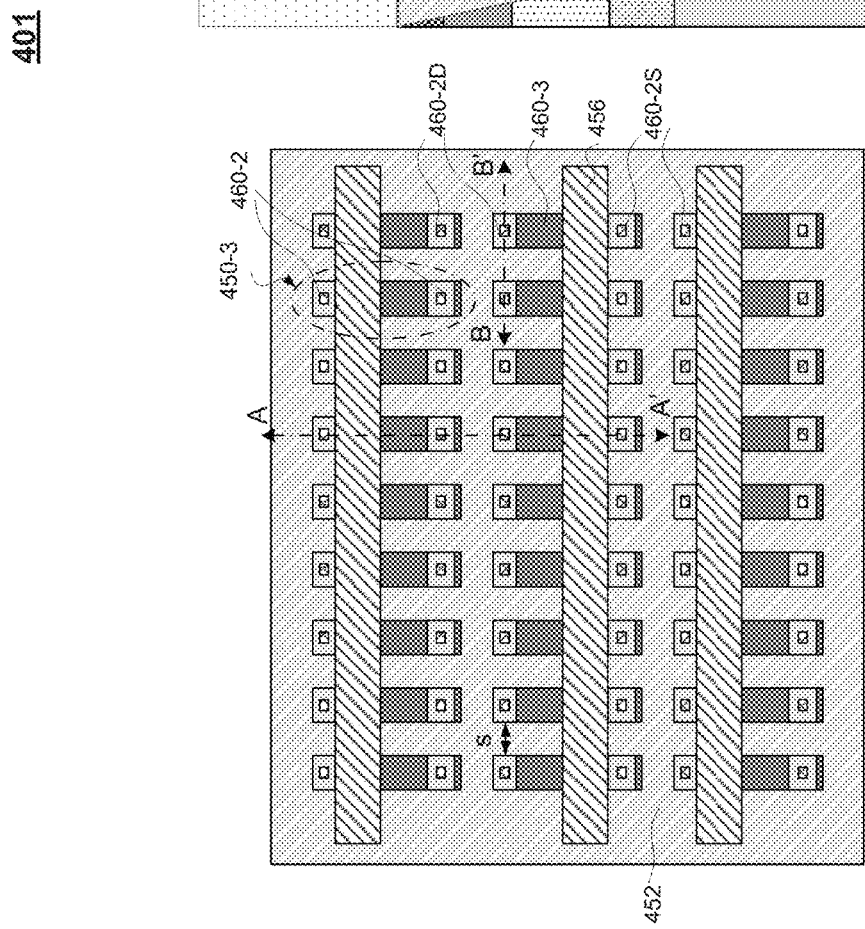
Fig. 4C
Fig. 4B

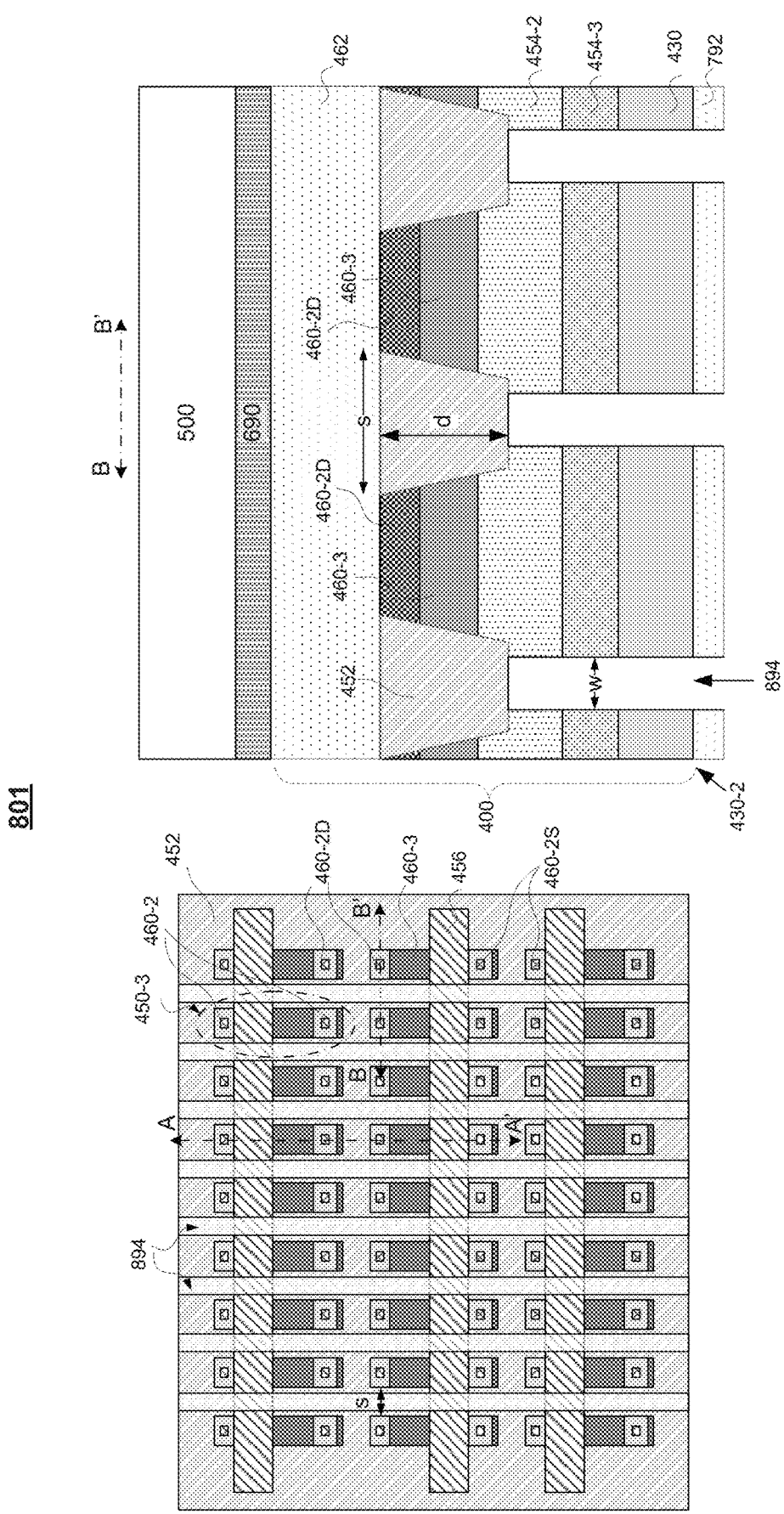

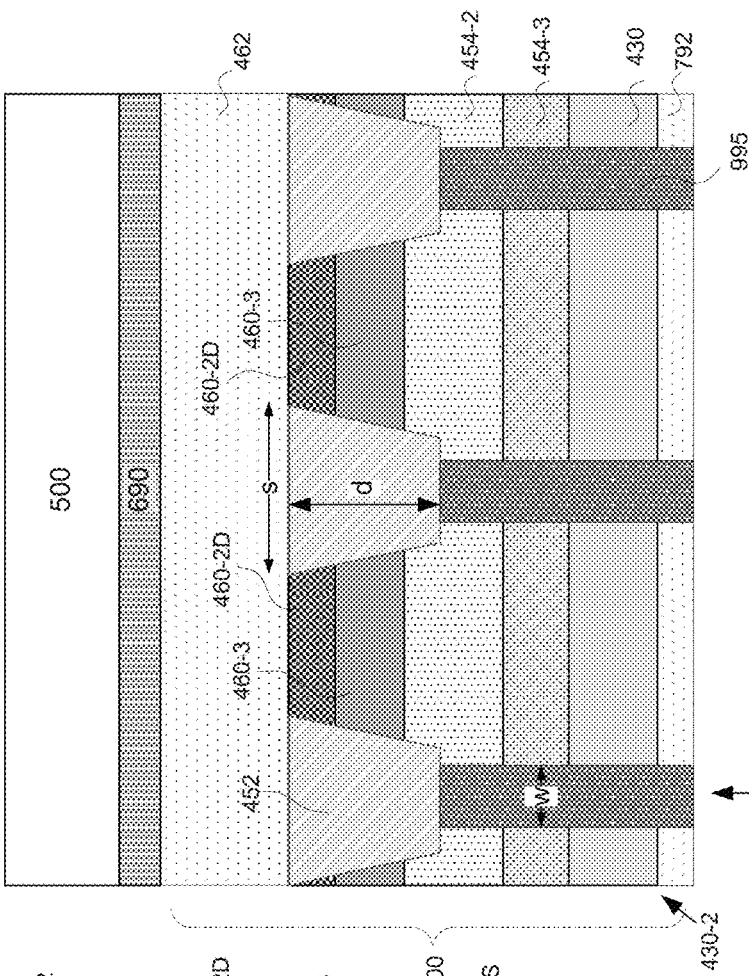
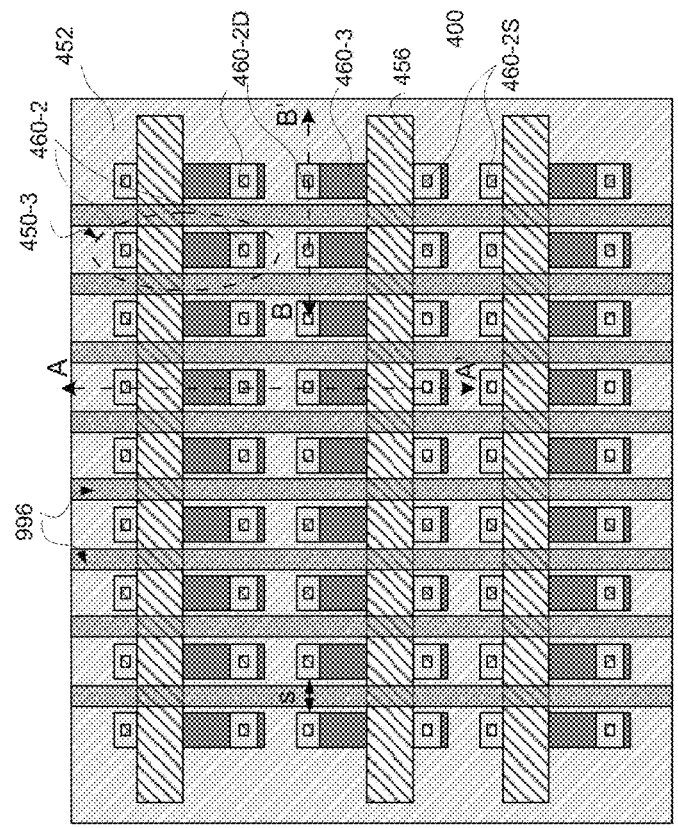
Fig. 9B
Fig. 9A

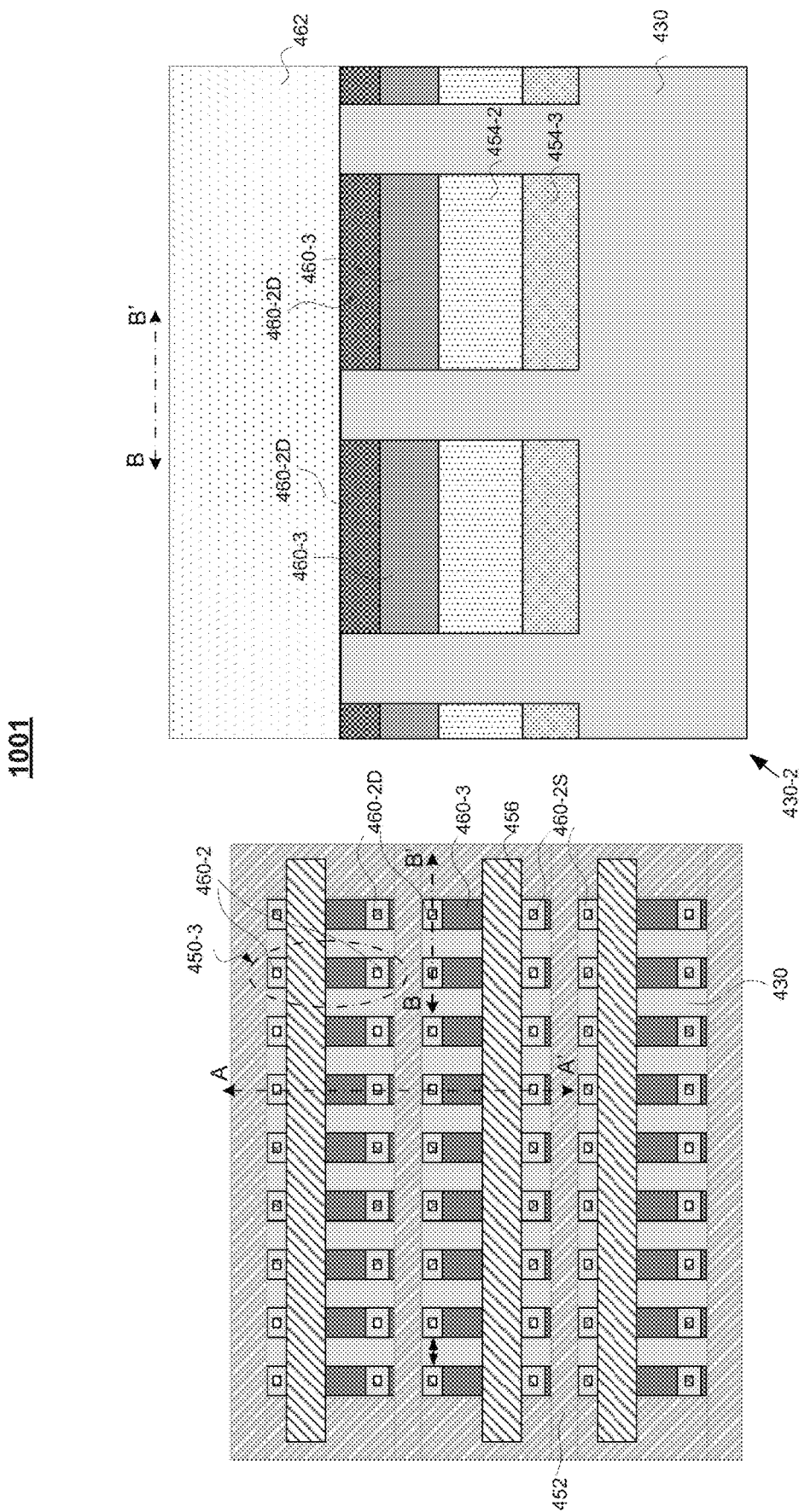

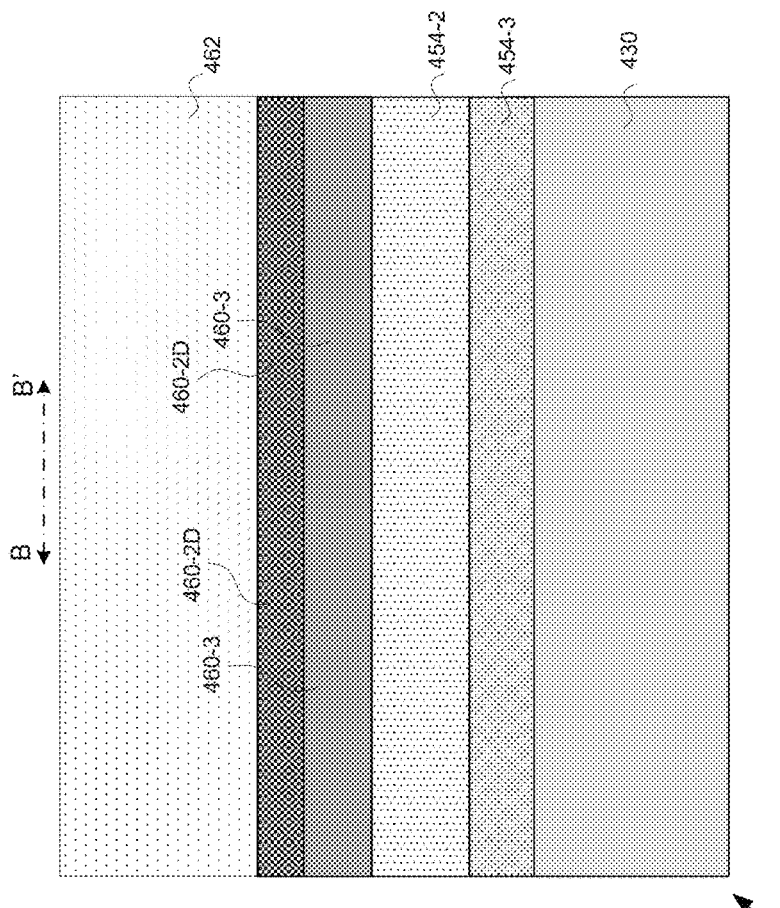
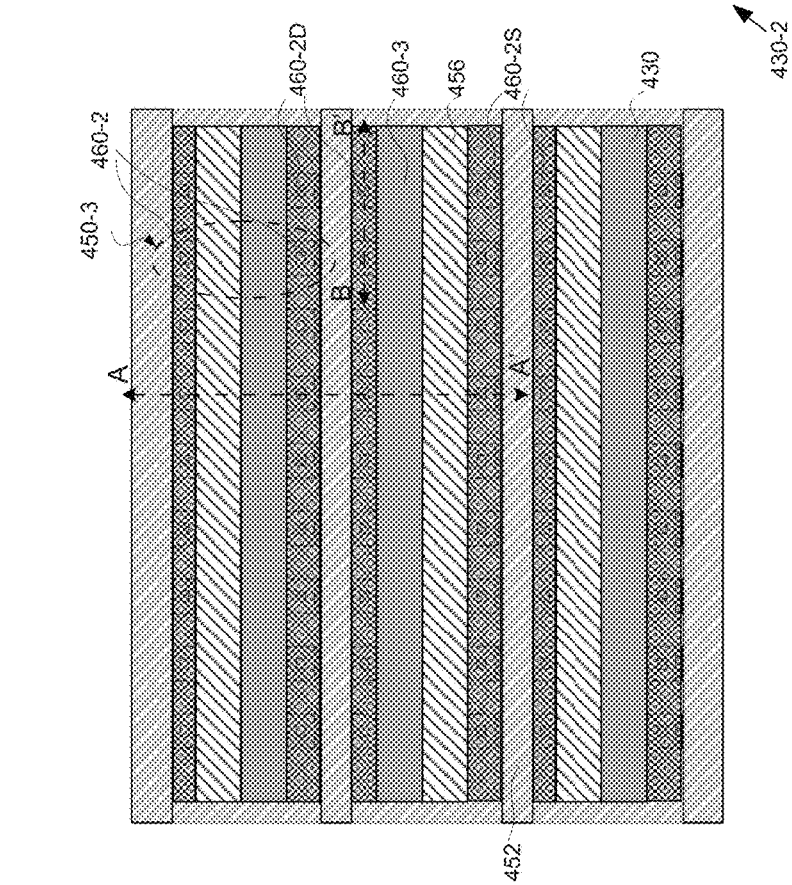
Fig. 10D
Fig. 10C

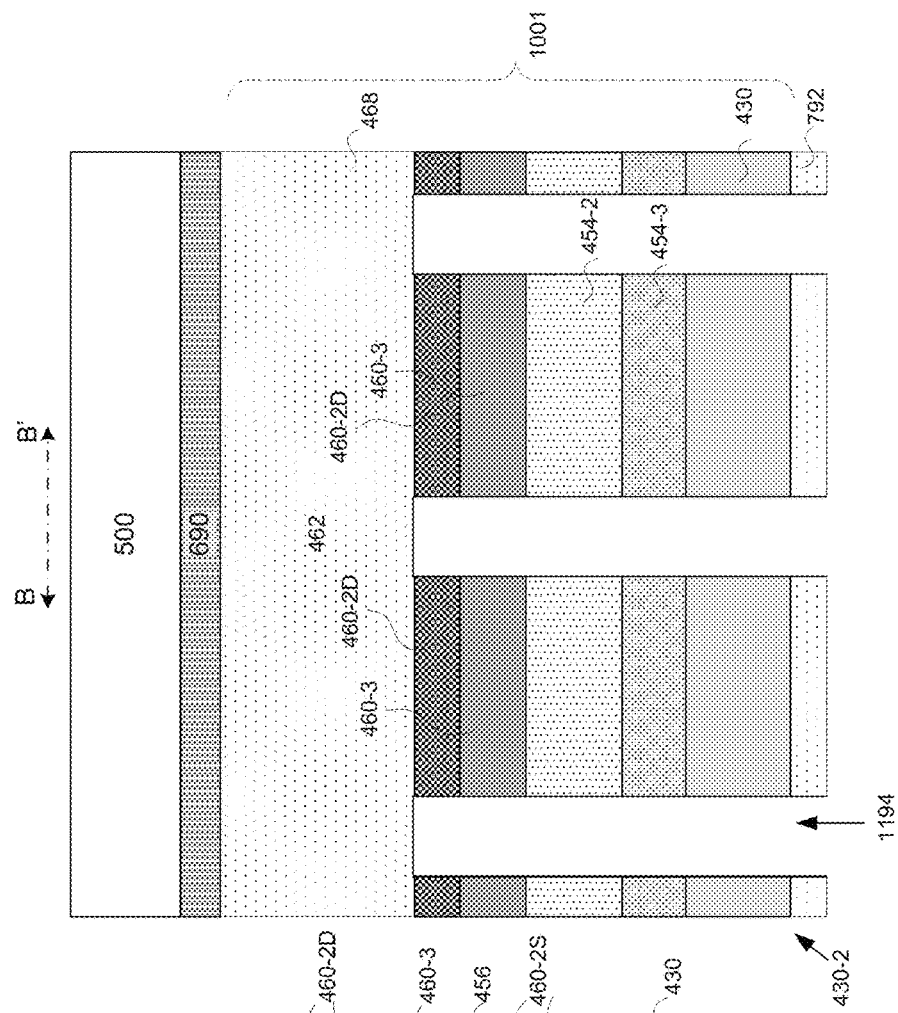
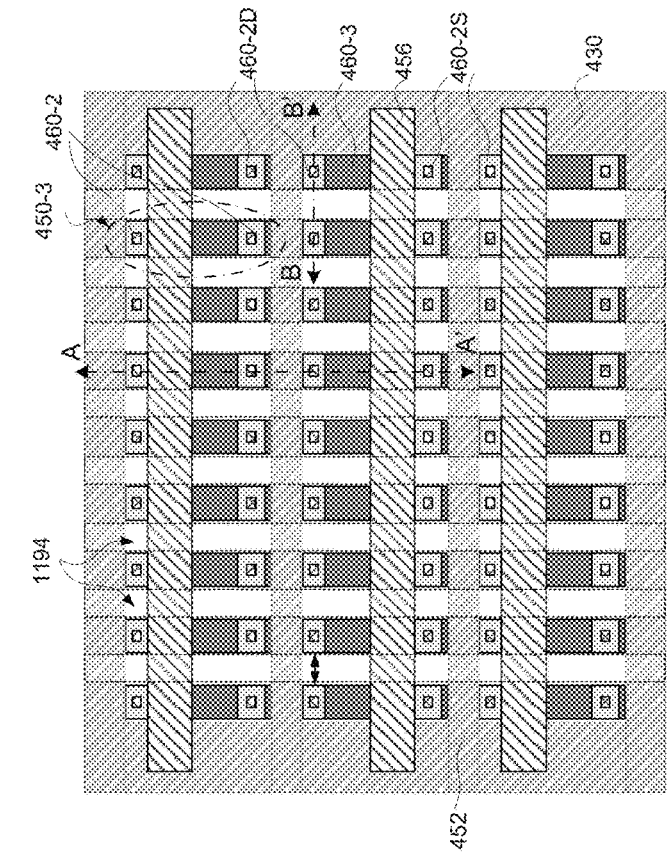
Fig. 11B
Fig. 11A

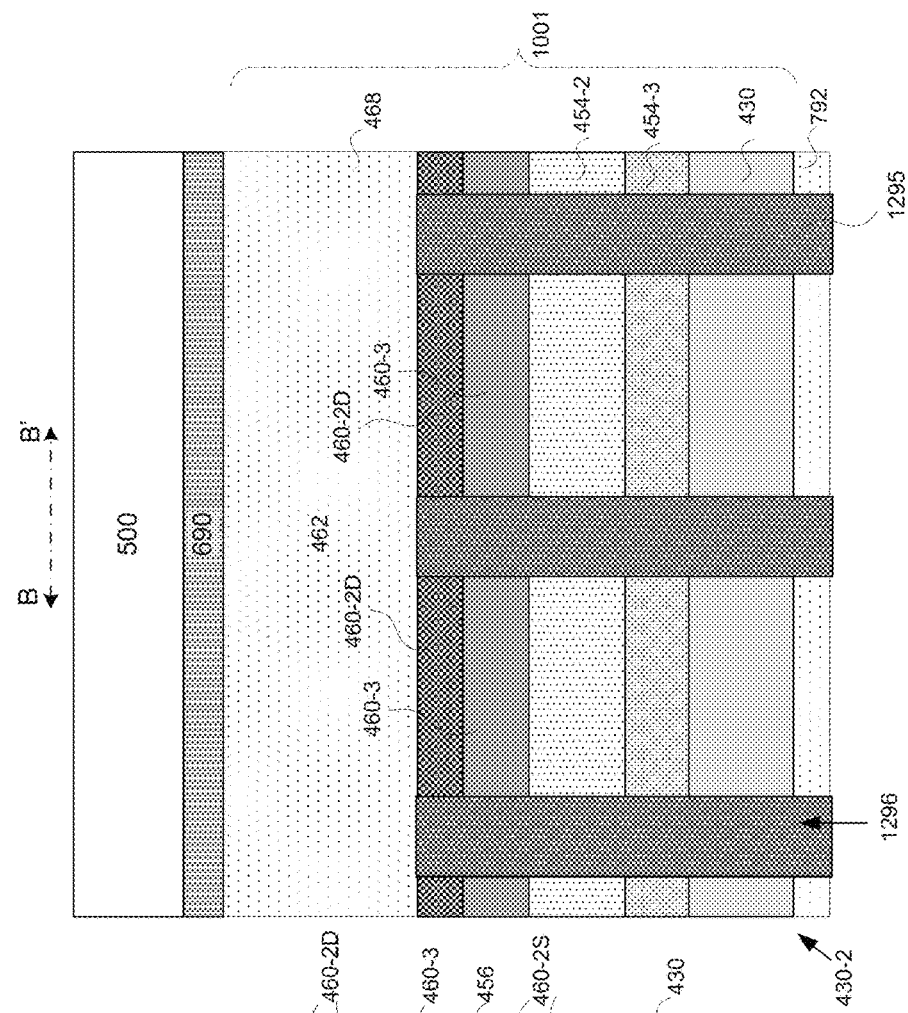
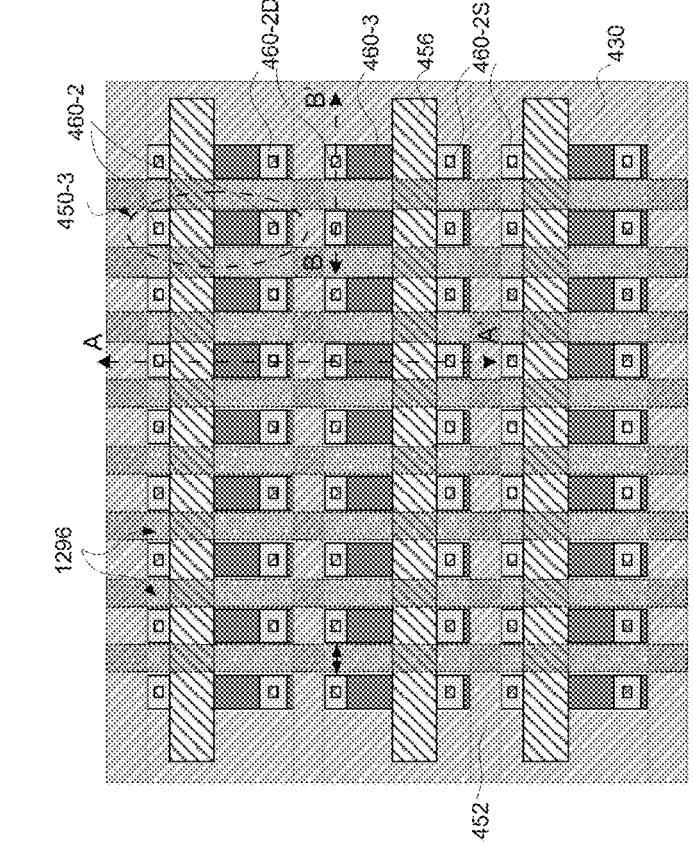
Fig. 12B
Fig. 12A

STRUCTURE AND METHOD FOR ISOLATION OF BIT-LINE DRIVERS FOR A THREE-DIMENSIONAL NAND

CROSS-REFERENCE TO RELATED APPLICATIONS AND INCORPORATION BY REFERENCE

This application is a divisional of U.S. patent application Ser. No. 16/729,821 filed on Dec. 30, 2019 and titled as "Structure and Method for Isolation of Bit-line Drivers for a Three-Dimensional NAND," which claims priority to PCT/CN2019/110978 filed on Oct. 14, 2019, both of which are incorporated herein by reference in their entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D memory, some peripheral circuits, such as bit-line drivers of a page buffer, use high voltage to support storage functions, for example, erasing and programing the memory cells. However as the dimensions of a 3D memory become smaller and smaller, isolation between the peripheral devices, for example bit-line drivers, becomes complicated. A need exists for an isolation that can provide the desired properties (e.g., low leakage current and high breakdown voltage) for a 3D memory to achieve high density and high performance.

BRIEF SUMMARY

Embodiments of a three-dimensional (3D) memory device and methods for forming the same are described in the present disclosure.

One aspect of the present disclosure provides a method for forming a 3D memory device that includes a peripheral circuitry formed on a first substrate. The peripheral circuitry includes a plurality of peripheral devices on a first side of the first substrate, a first interconnect layer disposed on the plurality of peripheral devices, and a deep-trench-isolation on a second side of the first substrate, wherein the first and second sides are opposite sides of the first substrate and the deep-trench-isolation is configured to provide electrical isolation between at least two neighboring peripheral devices. The 3D memory device also includes a memory array formed on a second substrate. The memory array includes at least one memory cell and a second interconnect layer disposed on the at least one memory cell, wherein the second interconnect layer of the memory array is bonded with the first interconnect layer of the peripheral circuitry, and at least one of the plurality of peripheral devices is electrically connected with the at least one memory cell.

In some embodiments, the deep-trench-isolation extends through the first substrate from the second side and contacts with a shallow-trench-isolation on the first side of the first substrate.

In some embodiments, the deep-trench-isolation extends through the first substrate from the second side and contacts with the first interconnect layer on the first side of the first substrate.

In some embodiments, the deep-trench-isolation includes a trench insulating layer, wherein the trench insulating layer includes silicon oxide, silicon nitride or silicon oxynitride.

In some embodiments, the 3D memory device also includes a dielectric capping layer on the second side of the first substrate, wherein the dielectric capping layer and the deep-trench-isolation are coplanar.

Another aspect of the present disclosure provides a method for forming a 3D memory device, which includes forming, on a first side of a first substrate, peripheral circuitry having a plurality of peripheral devices and a first interconnect layer. The method also includes forming, on a second substrate, a memory array having a plurality of memory cells and a second interconnect layer. The method further includes bonding the first interconnect layer of the peripheral circuitry with the second interconnect layer of the memory array, such that at least one of the peripheral devices of the peripheral circuitry is electrically connected with at least one of the memory cell of the memory array. The method also includes forming one or more deep-trench-isolations on a second side of the first substrate, wherein the first and second sides are opposite sides of the first substrate, and the one or more deep-trench-isolations are configured to provide electrical isolation between at least two neighboring peripheral devices.

In some embodiments, forming one or more deep-trench-isolations includes forming one or more trenches on the second side of the first substrate, and disposing a trench insulating layer inside the one or more trenches. In some embodiments, forming one or more trenches on the second side of the first substrate includes etching through the first substrate and exposing a portion of the first interconnect layer. In some embodiments, forming one or more deep-trench-isolations also includes removing a portion of the trench insulating layer located outside the one or more trenches. In some embodiments, removing a portion of the trench insulating layer includes chemical mechanical polishing.

In some embodiments, the method for forming the 3D memory device also includes thinning the first substrate from the second side after bonding the first and second interconnect layers.

In some embodiments, the method for forming the 3D memory device further includes, prior to forming one or more trenches, disposing a dielectric capping layer on the second side of the first substrate.

In some embodiments, the bonding of the first interconnect layer of the peripheral circuitry with the second interconnect layer of the memory array includes dielectric-to-dielectric bonding and metal-to-metal bonding at a bonding interface.

In some embodiments, a method for forming a three-dimensional (3D) memory device includes forming, on a first side of a first substrate, peripheral circuitry having a plurality of peripheral devices, a first interconnect layer, and one or more shallow-trench-isolations. The method also includes forming, on a second substrate, a memory array having a plurality of memory cells and a second interconnect layer. The method further includes bonding the first interconnect layer of the peripheral circuitry with the second interconnect layer of the memory array, such that at least one of the peripheral devices of the peripheral circuitry is electrically connected with at least one of the memory cells of the memory array. The method also includes forming one or more deep-trench-isolations on a second side of the first substrate, wherein the first and second sides are opposite sides of the first substrate and the one or more deep-trench-isolations are configured to provide electrical isolation for at least one of the peripheral devices.

In some embodiments, forming one or more deep-trench-isolations includes forming one or more trenches on the second side of the first substrate, and disposing a trench insulating layer inside the one or more trenches. In some embodiments, forming one or more trenches on the second side of the first substrate includes etching through the first substrate and exposing a portion of the first interconnect layer. In some embodiments, forming one or more trenches on the second side of the first substrate includes etching through the first substrate and exposing a portion of at least one of the shallow-trench-isolations on the first side of the first substrate. In some embodiments, forming one or more deep-trench-isolations also includes removing a portion of the trench insulating layer located outside the one or more trenches by a planarization process. In some embodiments, the planarization process includes chemical mechanical polishing.

In some embodiments, the bonding of the first interconnect layer of the peripheral circuitry with the second interconnect layer of the memory array comprises dielectric-to-dielectric bonding and metal-to-metal bonding at a bonding interface.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4B-4C illustrate top-down and cross-sectional views of a region in a peripheral circuitry, according to some embodiments of the present disclosure.

FIGS. 8A and 8B illustrate top-down and cross-sectional views of a 3D memory device with trenches, according to some embodiments of the present disclosure.

FIGS. 9A and 9B illustrate top-down and cross-sectional views of a 3D memory device with backside-deep-trench-isolations, according to some embodiments of the present disclosure.

FIGS. 10A and 10B illustrate top-down and cross-sectional views of a region in a peripheral circuitry, according to some embodiments of the present disclosure.

FIGS. 10C and 10D illustrate top-down and cross-sectional views of a region in a peripheral circuitry, according to some embodiments of the present disclosure.

FIGS. 11A and 11B illustrate top-down and cross-sectional views of a 3D memory device with trenches, according to some embodiments of the present disclosure.

FIGS. 12A and 12B illustrate top-down and cross-sectional views of a 3D memory device with backside-deep-trench-isolations, according to some embodiments of the present disclosure.

Figure 1:
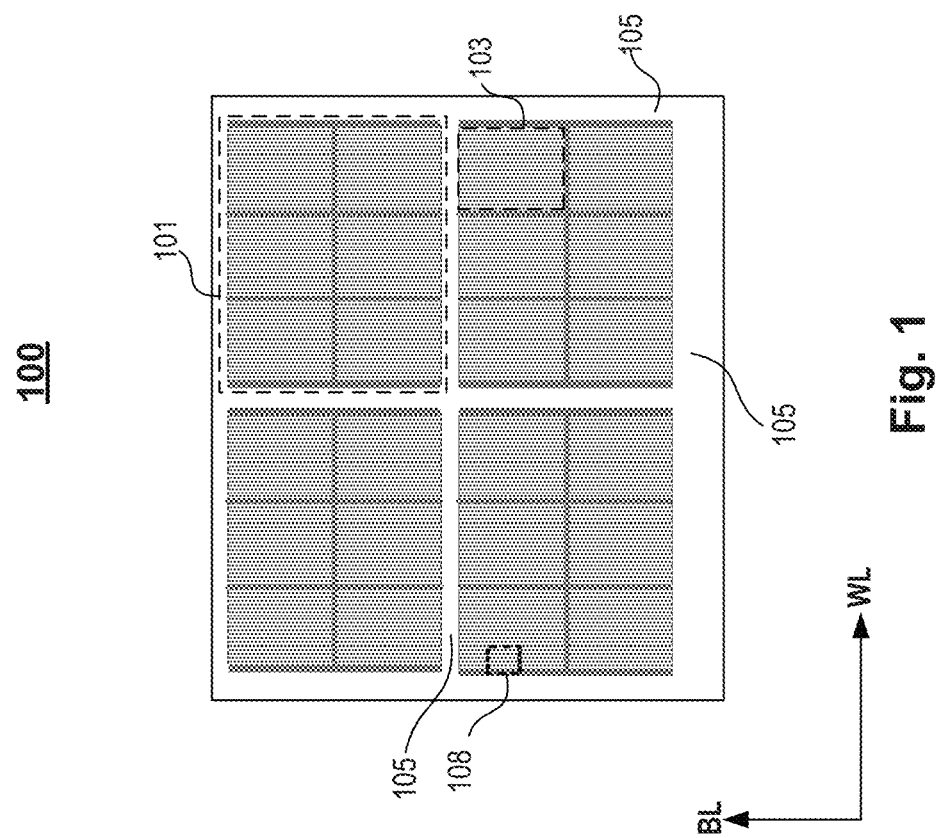
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

Various embodiments in accordance with the present disclosure provide structures and fabricating methods for electrical isolations between high density devices in a 3D NAND flash memory. By using backside-deep-trench-isolation instead of, or in addition to, conventional shallow-trench-isolation, performance and reliability properties (e.g., field punch-through and breakdown voltage) of the peripheral devices of a 3D memory (e.g., bit-line drivers) can be improved.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
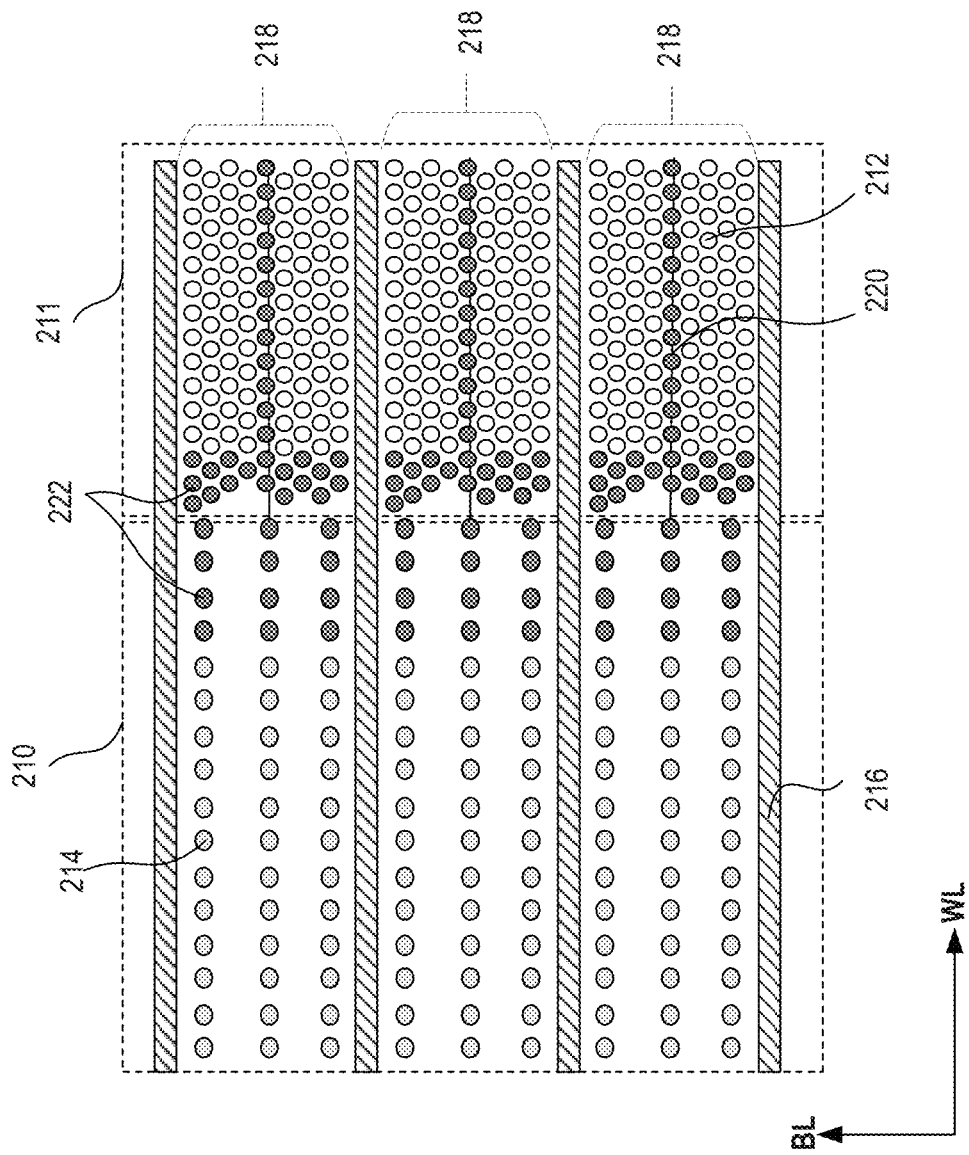
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of the memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings for process variation control during fabrication and/or for additional mechanical support.

Figure 3:
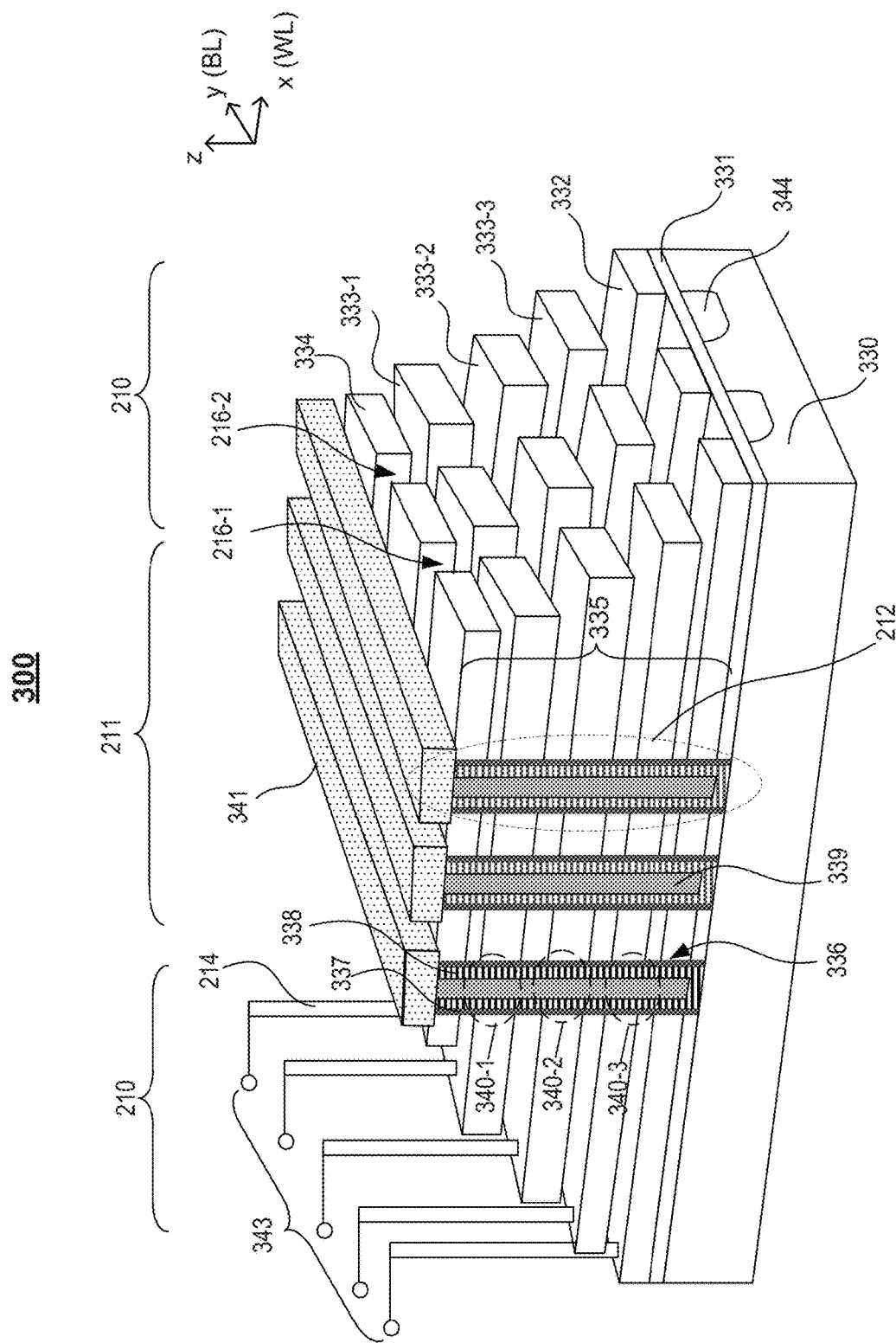
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy channel structure. These structures are not shown in FIG. 3 for simplicity.

To achieve higher storage density, the number of vertical WL stacks of a 3D memory or the number of memory cells per memory string has been greatly increased, for example, from 24 stacked WL layers (i.e. 24L) to 128 layers or more. To further reduce the size of a 3D memory, the memory array can be stacked on top of the peripheral circuitry or vice versa. For example, the peripheral circuitry can be fabricated on a first wafer and the memory array can be fabricated on a second wafer. Then the memory array and the peripheral circuitry can be connected through various interconnects by bonding the first and second wafers together. As such, not only the 3D memory density can be increased, but also communication between the peripheral circuitry and memory array can achieve higher bandwidth and lower power consumption since the interconnect lengths can be shorter through substrate (wafer) bonding. FIGS. 4A-4C, 5-6, 7A-7B, 8A-8B, 9A-9B, 10A-10D, 11A-11B, 12A-12B and 13 illustrate the structures and methods for forming a 3D memory device where peripheral circuitry is connected with memory array through wafer bonding, according to some embodiments of the present disclosure.

With the increase in the density and performance of the 3D memory device, improvement in the peripheral circuitry is also needed to provide functional support for the memory array, for example, reading, writing and erasing the data of the memory cells. Some devices of the peripheral circuitry operate under high voltage, for example bit-line drivers of a page buffer. In the meantime, scaling of the 3D memory device results in smaller dimensions of peripheral devices and shorter distances between adjacent ones. Therefore, improvements in electrical isolation is necessary for high density and/or high voltage peripheral devices. FIGS. 4A-4C, 5-6, 7A-7B, 8A-8B, 9A-9B, 10A-10D, 11A-11B, 12A-12B and 13 illustrate the structures and methods for forming a backside-deep-trench-isolation (BDTI) of a 3D memory device at various process stages, according to some embodiments of the present disclosure.

Figure 4A:
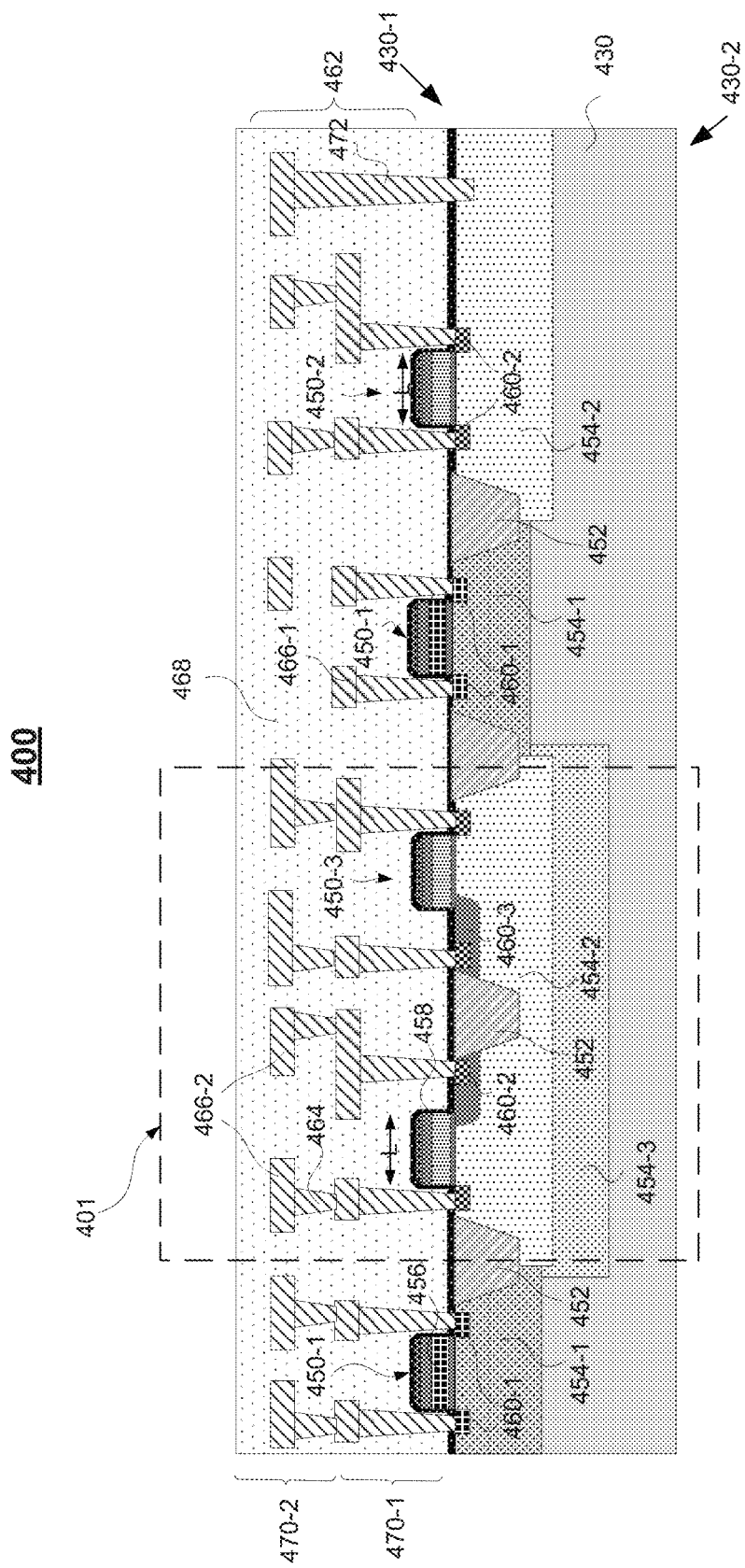
FIG. 4A illustrates a cross-sectional view of a peripheral circuitry, according to some embodiments of the present disclosure.

FIG. 4A illustrates a cross-section of an exemplary peripheral circuitry 400 of a 3D memory device according to some embodiments of the present disclosure. The peripheral circuitry 400 can include a first substrate 430, where the first substrate 430 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, the first substrate 430 can be double-side polished prior to peripheral device fabrication. In this example, the first substrate 430 includes surfaces on the top and bottom sides (also referred to as a first side 430-1 and a second side 430-2, or a front side and a backside, respectively) both polished and treated to provide a smooth surface for high quality semiconductor devices. The first and second sides 430-1 and 430-2 are opposite sides of the first substrate 430.

The peripheral circuitry 400 can include one or more peripheral devices 450 (e.g. 450-1, 450-2, 450-3, etc.) on a first side 430-1 of the first substrate 430. The peripheral device 450 can be formed "on" the first substrate 430, in which the entirety or part of the peripheral device 450 is formed in the first substrate 430 (e.g., below the top surface of the first substrate 430) and/or directly on the first substrate 430. The peripheral device 450 can include any suitable semiconductor devices, for example, metal oxide semiconductor field effect transistors (MOSFETs), bipolar junction transistors (BJTs), diodes, resistors, capacitors, inductors, etc. Among the semiconductor devices, p-type and/or n-type MOSFETs (i.e., CMOS) are widely implemented in logic circuit design, and are used as examples for the peripheral device 450 in the present disclosure. In this example, the peripheral circuitry 400 is also referred to CMOS wafer 400.

The peripheral device 450 can be either a p-channel MOSFET or an n-channel MOSFET and can include, but not limited to, an active device region surrounded by shallow-trench-isolation (STI) 452, a well 454 (e.g., 454-1, 454-2, 454-3, etc.) formed in the active device region with n-type or p-type doping, a gate stack 456 that includes a gate dielectric, a gate conductor and/or a gate hard mask. The peripheral device 450 can also include a source/drain extension and/or halo region (not shown in FIG. 4A), a gate spacer 458 and a source/drain 460 (e.g., 460-1, 460-2, etc.) locating on each side of the gate stack. The peripheral device 450 can further include a silicide contact area (not shown) in the top portion of the source/drain. Other known devices (e.g., diodes, capacitors, resistors, etc.) can be also formed on the first substrate 430. The structure and fabrication method of the peripheral device 450, are known to those skilled in the art, and are incorporated herein for entirety.

The STI 452 can be formed through patterning the substrate using lithography and etching, filling an insulating material and polishing the insulating material to form a coplanar surface on the first substrate 430. The insulating material for STI 452 can include silicon oxide, silicon oxynitride, TEOS, low-temperature oxide (LTO), high temperature oxide (HTO), silicon nitride, etc. The insulating material for STI 452 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI 452 can also include a high temperature annealing step to densify the disposed insulating material for improved electrical isolation. Other STI structures can be employed, as would be apparent to a person of ordinary skill in the art.

The well 454 of the peripheral device 450 can include a p-type doped well for n-channel MOSFET 454-2 and an n-type doped well for p-channel MOSFET 454-1, and is called p-well 454-2 and n-well 454-1, respectively. The dopant profile and concentration of the well 454 affects the device characteristics of the peripheral device 450. For MOSFET devices with low threshold voltage ($V_t$), the well 454 can be doped with lower concentration, and can form low-voltage p-well or low-voltage n-well. For MOSFET with high $V_t$, the well 454 can be doped with higher concentration, and can form high-voltage p-well or high-voltage n-well. In some embodiments, to provide electrical isolation from a p-type substrate, a deep n-well 454-3 can be formed underneath a high-voltage p-well 454-2 for an n-channel MOSFET 450-3 with high $V_t$ (also referred to as high-voltage nMOSFET or HV NMOS 450-3).

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 456 of the peripheral device 450 can be formed by a "gate first" scheme, where the gate stack 456 is disposed and patterned prior to source/drain formation. The gate stack 456 of the peripheral device 450 can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, or combinations thereof.

In some embodiments, the gate conductor can be made from a metal or metal alloy, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor with aforementioned materials.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

The gate spacer 458 can be formed through disposing an insulating material and then performing anisotropic etching. The insulating material for the gate spacer 458 can be any insulator, including silicon oxide, silicon nitride, silicon oxynitride, TEOS, LTO, HTO, etc. The gate spacer 458 can be disposed using techniques such as CVD, PVD, PECVD, LPCVD, RTCVD, MOCVD, ALD, sputtering, or combinations thereof. The anisotropic etching of the gate spacer 458 includes dry etching, for example reactive ion etching (RIE).

A gate length L of the gate stack 456 between the source/drain 460 is an important feature of the MOSFET.

During operation of a MOSFET, a top portion of the well underneath the gate stack 456 can transport charged carriers from source to drain, and is so called channel of the MOSFET. The gate length L (also referred to as channel length) determines the magnitude of the current of a MOSFET and is scaled down aggressively for logic circuits. The gate length L can be less than about 100 nm. In some embodiments, the gate length can be in a range between about 5 nm to about 30 nm. Patterning of the gate stack with such a small dimension is very challenging, and can use techniques including optical proximity correction, double exposure and/or double etching, self-aligned double patterning, etc.

In some embodiments, the source/drain 460 of the peripheral device 450 is incorporated with high concentration dopants. For n-type MOSFETs 450-2, the dopant for source/drain 460-2 can include any suitable n-type dopant, such as phosphorus, arsenic, antimony, etc., and/or any combination thereof. For p-type MOSFETs 450-1, the dopant for source/drain 460-1 can include any suitable p-type dopant, for example boron. The dopant incorporation can be achieved through ion implantation followed by dopant activation anneal. The source/drain 460 can be made of the same material as the first substrate 430, for example, silicon. In some embodiments, the source/drain 460 of the peripheral device 450 can be made of a different material from the first substrate 430 to achieve high performance. For example, on a silicon substrate, the source/drain 460-1 for a p-type MOSFETs can include SiGe and the source/drain 460-2 for an n-type MOSFETs can be incorporated with carbon. The forming of the source/drain 460 with a different material can include etching back the substrate material in the source/drain area and disposing new source/drain material using techniques such as epitaxy. Doping for source/drain 460 can also be achieved through in-situ doping during epitaxy. In some embodiments, the peripheral device 450 (e.g., HV NMOS 450-3) can have a lightly-doped-drain (LDD) 460-3 between the drain 460-2 and the gate stack 456. The LDD 460-3 can reduce electric field when the drain 460-2 is applied with high voltage.

The peripheral device 450 can also have an optional source/drain extension and/or halo region (not shown in FIG. 4A) along each side of the gate stack 456. The source/drain extension and/or halo region locates inside the active device region below the gate stack, and is implemented mainly for improved short channel control for the peripheral device 450 with a channel length less than about 0.5 µm. The forming of the source/drain extension and/or halo region can be similar to the forming of the source/drain 460, but may use different implantation conditions (e.g., dose, angle, energy, species, etc.) to obtain optimized doping profile, depth or concentration.

The peripheral device 450 can be formed on the first substrate 430 with a planar active device region (as shown in FIG. 4A), where the direction of MOSFET's channel and current flow is parallel to a surface of the first substrate 430. In some embodiments, the peripheral device 450 can also be formed on the first substrate 430 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

In some embodiments, the peripheral circuitry 400 can include a peripheral interconnect layer 462 (or a first interconnect layer) on the first side 430-1, above the peripheral devices 450, to provide electrical connections between different peripheral devices 450 and external devices (e.g., power supply, another chip, I/O device, etc.). The peripheral interconnect layer 462 can include one or more interconnect structures, for example, one or more vertical contact structures 464 and one or more lateral conductive lines 466 (e.g., 466-1, 466-2, etc.). The contact structure 464 and conductive line 466 can broadly include any suitable types of interconnects, such as middle-of-line (MOL) interconnects and back-end-of-line (BEOL) interconnects. The contact structure 464 and conductive line 466 in the peripheral circuitry 400 can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), metal alloys, or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The peripheral interconnect layer 462 can further include an insulating layer 468. The insulating layer 468 in the peripheral interconnect layer 462 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof.

In FIG. 4A, two conductive levels 470-1 and 470-2 (also referred to as "metal levels") are illustrated as an example, where each metal level 470 (e.g., 470-1 or 470-2) include the contact structures 464 and the conductive lines 466. The conductive lines 466 of the same metal level are located at the same distance from the first substrate 430. The number of metal levels 470 for the peripheral circuitry 400 is not limited and can be any number optimized for the performance of the 3D memory.

The peripheral interconnect layer 462 can be formed by stacking metal levels 470 from bottom to the top of the peripheral circuitry 400. In the example of the peripheral circuitry 400 in FIG. 4A, the bottom metal level 470-1 can be formed first and then the upper metal level 470-2 can be formed on top of the bottom metal level 470-1. Fabrication processes of each metal level 470 can include, but not limited to, disposing a portion of the insulating layer 468 with a thickness required for the metal level, patterning the portion of the insulating layer 468 using photo lithography and dry/wet etching to form contact holes for the contact structures 464 and the conductive lines 466, disposing conductive materials to fill the contact holes for the contact structures 464 and the conductive lines 466, and removing excessive conductive materials outside the contact holes by using planarization process such as chemical mechanical polishing (CMP) or reactive ion etching (RIE).

In some embodiments, peripheral circuitry 400 also includes one or more substrate contacts 472, where the substrate contacts 472 provide electrical connections to the first substrate 430. The substrate contact 472 can include one or more conductive levels 470 with multiple tiers of vertical contact structures 464 and lateral conductive lines 466. In FIG. 4A, substrate contact 472 with one tier of contact structure and conductive line is shown as an example, where the vertical contact structure of the substrate contact 472 extends through the insulating layer 468 and electrically contacts the first substrate 430. In some embodiments, the first substrate 430 is p-type and the substrate contact 472 can contact with the p-well 454-2.

In some embodiments, the topmost conductive lines 466 (e.g., 466-2 in FIG. 4A) can be exposed as the top surface of the peripheral circuitry 400, where the topmost conductive lines 466-2 can be directly connected with the conductive lines on another chip or an external device.

In some embodiments, the topmost conductive lines 466-2 can be embedded inside the insulating layer 468 (as shown in FIG. 4A), where the insulating material on top of the conductive lines 466 provide scratch protection during shipping or handling. Electrical connections to the topmost conductive lines 466 can be established later by forming metal VIAs, or simply by etching back the insulating layer 468 using dry/wet etching.

The peripheral device 450, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some embodiments, the peripheral device 450 other than MOSFET can also be fabricated with additional design and/or lithography mask levels to achieve specific circuit requirements.

In some embodiments, a plurality of the peripheral devices 450 can be used to form any digital, analog, and/or mixed-signal circuits for the operation of the peripheral circuitry 400. The peripheral circuitry 400 can perform, for example, row/column decoding, timing and control, reading, writing and erasing data of the memory array, etc.

FIG. 4B illustrates a top-down view of a peripheral region 401, according to some embodiments of the present disclosure. The peripheral region 401 can be a portion of the peripheral circuitry 400 in FIG. 4A, for example, a portion of a page buffer. A cross-section along a line AA' in the peripheral region 401 is shown in FIG. 4A. In FIG. 4B, the peripheral interconnect layer 462 in FIG. 4A is omitted to show materials and structures underneath.

In some embodiments, the peripheral devices 450, for example high-voltage nMOSFET (HV NMOS) 450-3, in the peripheral region 401 are densely distributed. For example in a page buffer, HV NMOS 450-3 can be used to drive bit-lines in a memory array to program and erase storage data. As such, HV NMOS 450-3 in the page buffer can be laid out in rows and columns of a configuration similar to an array.

As the word lines and bit-lines of a memory array become denser in a 3D memory, dimensions of the peripheral devices 450 and spacing between adjacent ones are getting smaller. For example, spacing "s" between neighboring HV NMOS 450-3 is driven to smaller dimension as 3D memory technology advances.

In FIG. 4B, an active device area of the HV NMOS 450-3 is a semiconductor area surrounded by the STI 452. To support high voltage operation, the source/drain 460-2 of HV NMOS 450-3 can be disposed asymmetrically on opposite sides of the gate stack 456, where a drain 460-2D can be further away from the gate stack 456 and a source 460-2S can be closer to the gate stack 456. The LDD 460-3 can be disposed between the gate stack 456 and the drain 460-2D to reduce electric field when the drain 460-2D is applied with high voltage.

FIG. 4C illustrates a cross-sectional view of the peripheral region 401 along a line BB', according to some embodiments of the present disclosure. In FIG. 4C, the contact structure 464 and conductive lines 466 of the peripheral interconnect layer 462 are omitted for simplicity.

In some embodiments, STI 452 can be disposed between neighboring drains 460-2D with a width equivalent to the spacing "s". The LDD 460-3 can be disposed beneath each drain 460-2D to reduce electrical field between drain 460-2D and well 454-2.

In some embodiments, the peripheral devices 450 in the peripheral region 401 can include HV NMOS 450-3. In this example, the drain 460-2D can be highly doped with n-type dopants, the LDD 460-3 can be relatively lightly doped with n-type dopants, and the well 454-2 can be doped with p-type dopants. The deep n-well 454-3 can isolate the p-well 454-2 from p-type substrate 430. In this configuration, drain 460-2D and LDD 460-3 can be isolated from the substrate by PN junctions formed at interfaces between LDD 460-3 and p-well 454-2, between p-well 454-2 and deep n-well 454-3, and between deep n-well 454-3 and p-type substrate 430. In the meantime, the drain 460-2D and LDD 460-3 can be isolated from neighboring ones by STI 452 and PN junctions formed at interfaces between p-well 454-2 and LDD 460-3. In this example, the STI 452 is shallower than the p-well 454-2 and the deep n-well 454-3.

In some embodiments, leakage current and breakdown voltage of peripheral device 450 depend on dopant concentration/profile, applied voltage, as well as physical dimensions such as depths of the wells 454, the spacing "s" and a depth "d" of STI 452, etc. Electrical isolation of peripheral devices can be improved by, for example, deeper wells 454 using higher implantation energy. Deeper STI 452 can also be formed with higher aspect ratio etching. However these adjustments can have a limit due to device performance and reliability requirement as well as process complexity. As such, improvement in isolation structures is needed to support operation of peripheral circuitry 400 for a 3D memory, and will be discussed in details next.

Figure 5:
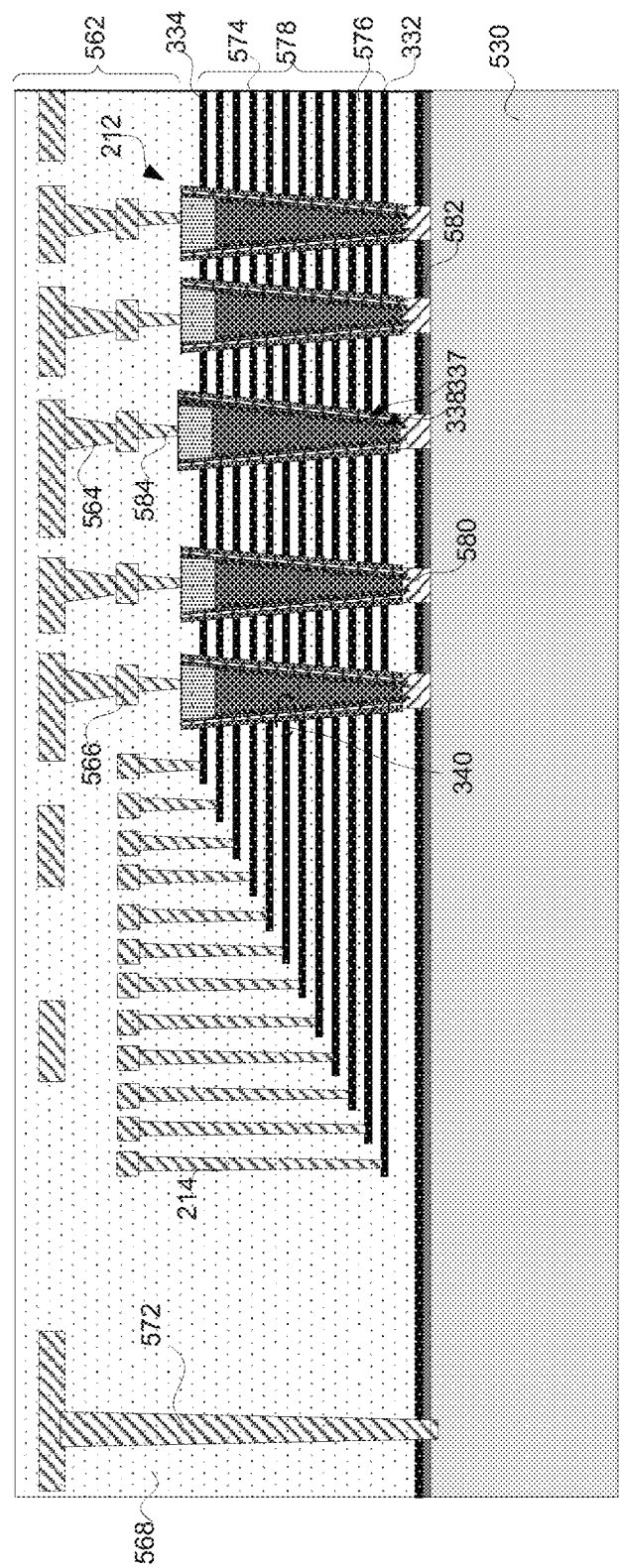
FIG. 5 illustrates a cross-sectional view of a memory array, according to some embodiments of the present disclosure.

FIG. 5 illustrates a cross-section of an exemplary 3D memory array 500, according to some embodiments of the present disclosure. The 3D memory array 500 can be a 3D NAND memory array and can include a second substrate 530, the memory cells 340 and an array interconnect layer 562 (or a second interconnect layer). The second substrate 530 can be similar to the first substrate 430. The array interconnect layer 562 can be similar to the peripheral interconnect layer 462 and can be formed using similar materials and similar processes. For example, interconnect structures (e.g., contact structures 564 and conductive lines 566) and insulating layer 568 of the array interconnect layer 562 are similar to the interconnect structures (e.g., contact structures 464, conductive lines 466) and insulating layer 468 of the peripheral interconnect layer 462, respectively.

In some embodiments, the 3D memory array 500 can be a memory array for 3D NAND Flash memory in which the memory cells 340 can be stacked vertically as the memory strings 212. The memory string 212 extends through a plurality of conductor layer 574 and dielectric layer 576 pairs. The plurality of conductor/dielectric layer pairs are also referred to herein as an "alternating conductor/dielectric stack" 578. The conductor layers 574 and the dielectric layers 576 in alternating conductor/dielectric stack 578 alternate in the vertical direction. In other words, except the ones at the top or bottom of the alternating conductor/dielectric stack 578, each conductor layer 574 can be sandwiched by two dielectric layers 576 on both sides, and each dielectric layer 576 can be sandwiched by two conductor layers 574 on both sides. The conductor layers 574 can each have the same thickness or have different thicknesses. Similarly, the dielectric layers 576 can each have the same thickness or have different thicknesses. In some embodiments, the alternating conductor/dielectric stack 578 includes more conductor layers or more dielectric layers with different materials and/or thicknesses than the conductor/dielectric layer pair. The conductor layers 574 can include conductor materials such as W, Co, Cu, Al, Ti, Ta, TiN, TaN, Ni, doped silicon, silicides (e.g., $NiSi_x$, $WSi_x$, $CoSi_x$, $TiSi_x$) or any combination thereof. The dielectric layers 576 can include dielectric materials such as silicon oxide, silicon nitride, silicon oxynitride, or any combination thereof.

As shown in FIG. 5, each memory string 212 can include the channel layer 338 and the memory film 337. In some embodiments, the channel layer 338 includes silicon, such as amorphous silicon, polysilicon, or single crystalline silicon. In some embodiments, the memory film 337 is a composite layer including a tunneling layer, a storage layer (also known as "charge trap/storage layer"), and a blocking layer. Each memory string 212 can have a cylinder shape (e.g., a pillar shape). The channel layer 338, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, each conductor layer 574 in alternating conductor/dielectric stack 578 can act as the control gate for each memory cell of memory string 212 (for example control gates 333 in FIG. 3). As shown in FIG. 5, the memory string 212 can include the lower select gate 332 (e.g., a source select gate) at a lower end of the memory string 212. The memory string 212 can also include the top select gate 334 (e.g., a drain select gate) at an upper end of the memory string 212. As used herein, the "upper end" of a component (e.g., memory string 212) is the end further away from second substrate 530 in the vertical direction, and the "lower end" of the component (e.g., memory string 212) is the end closer to second substrate 530 in the vertical direction. As shown in FIG. 5, for each memory string 212, the drain select gate 334 can be above the source select gate 332. In some embodiments, the select gates 332/334 include conductor materials such as W, Co, Cu, Al, doped silicon, silicides, or any combination thereof.

In some embodiments, the 3D memory array 500 includes an epitaxial layer 580 on an lower end of the channel layer 338 of the memory string 212. The epitaxial layer 580 can include a semiconductor material, such as silicon. The epitaxial layer 580 can be epitaxially grown from a semiconductor layer 582 on the second substrate 530. The semiconductor layer 582 can be un-doped, partially doped (in the thickness direction and/or the width direction), or fully doped by p-type or n-type dopants. For each memory string 212, the epitaxial layer 580 is referred to herein as an "epitaxial plug." The epitaxial plug 580 at the lower end of each memory string 212 can contact both the channel layer 338 and a doped region of semiconductor layer 582. The epitaxial plug 580 can function as the channel of the lower selective gate 332 at the lower end of memory string 212.

In some embodiments, the array device further includes multiple contact structures 214 of word lines (also referred to as word line contacts) in the staircase region 210. Each word line contact structure 214 can form electrical contact with the corresponding conductor layer 574 in the alternating conductor/dielectric stack 578 to individually control the memory cell 340. The word line contact structure 214 can be formed by dry/wet etching of a contact hole, followed by filling with a conductor, for example, W, Ti, TiN, Cu, TaN, Al, Co, Ni, or any combination thereof.

As shown in FIG. 5, the 3D memory array 500 also includes bit line contacts 584 formed on the top of the memory strings 212 to provide individual access to the channel layer 338 of the memory strings 212. The conductive lines connected with the word line contact structures 214 and the bit line contacts 584 form word lines and bit lines of the 3D memory array 500, respectively. Typically the word lines and bit lines are laid perpendicular to each other (e.g., in rows and columns, respectively), forming an "array" of the memory.

In some embodiments, the 3D memory array 500 also includes a substrate contact 572 of the second substrate 530. The substrate contact 572 can be formed using similar material and process as the substrate contact 472 of the first substrate 430. The substrate contact 572 can provide electrical connection to the second substrate 530 of the 3D memory array 500.

Figure 6:
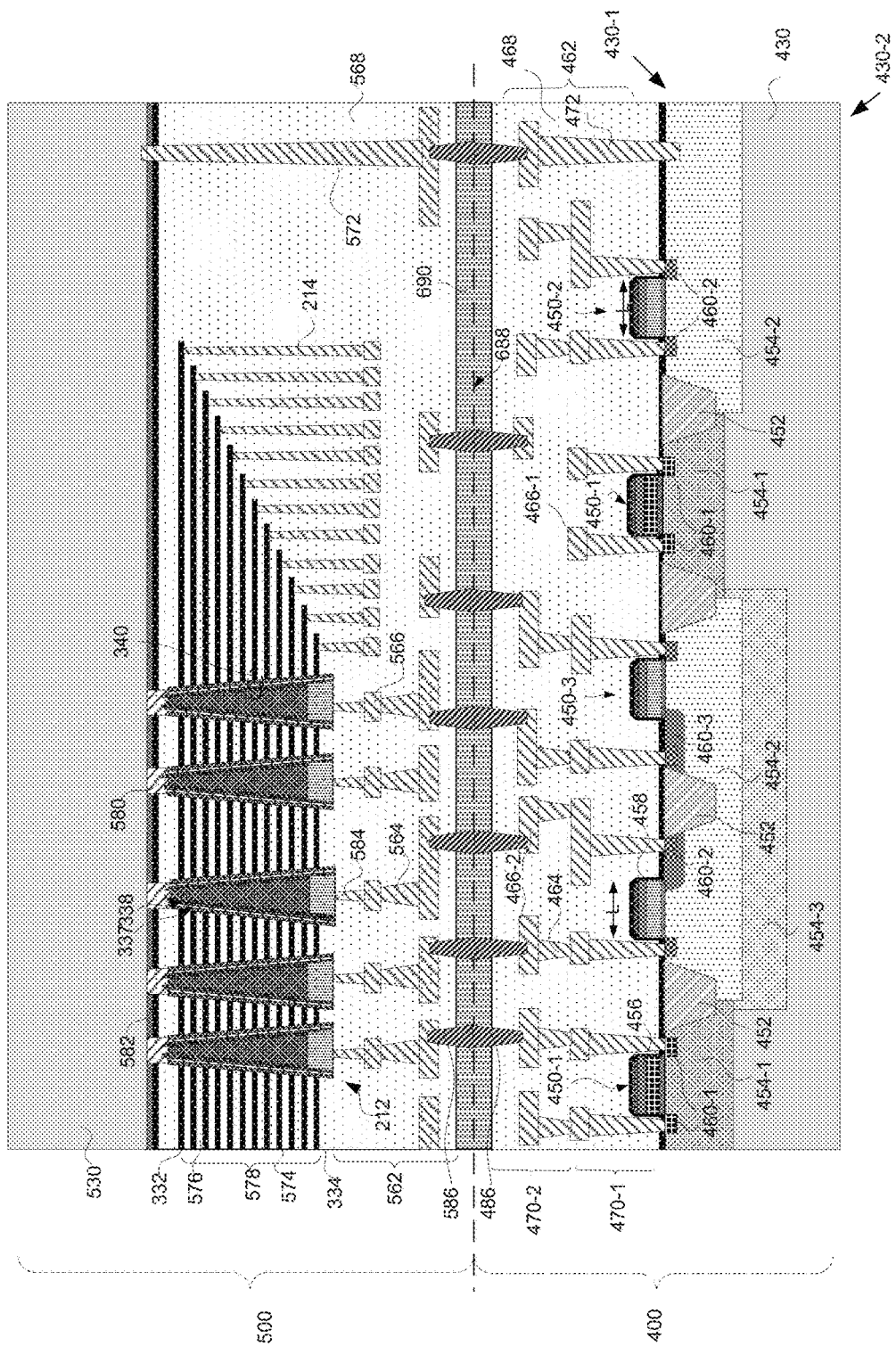
FIG. 6 illustrates a cross-sectional view of a 3D memory device after bonding the peripheral circuitry and the memory array, according to some embodiments of the present disclosure.

FIG. 6 illustrates a cross-section of an exemplary 3D memory device 600, according to some embodiments of the present disclosure. The 3D memory device 600 includes the peripheral circuitry 400 fabricated on the first substrate 430 and the 3D memory array 500 fabricated on the second substrate 530. In this example, the 3D memory array 500 is flipped upside down and joined with the peripheral circuitry 400 with direct bonding or hybrid bonding. At a bonding interface 688, the peripheral circuitry 400 and the 3D memory array 500 are electrically connected through a plurality of interconnect VIAs 486/586.

In some embodiments, the bonding interface 688 of the 3D memory device 600 situates between the insulating layer 468 of the peripheral interconnect layer 462 and the insulating layer 568 of the array interconnect layer 562. Interconnect VIAs 486 and 586 can be joined at bonding interface 688 to electrically connect any conductive line 466 or contact structure 464 of the peripheral interconnect layer 462 and any conductive line 566 or contact structure 564 of the array interconnect layer 562. As such, the peripheral circuitry 400 and the 3D memory array 500 can be electrically connected.

In some embodiments, the bonding interface 688 of the 3D memory device 600 situates inside a bonding layer 690. In this example, the interconnect VIAs 486 and 586 extend through the bonding layer 690 and also form electrical connections between any conductive line 466 or contact structure 464 of the peripheral interconnect layer 462 and the conductive line 566 or contact structure 564 of the array interconnect layer 562. As such, the peripheral circuitry 400 and the 3D memory array 500 can also be electrically connected.

In some embodiments, the bonding layer 690 can be disposed on top of the peripheral circuitry 400 (in FIG. 4A) and/or the 3D memory array 500 (in FIG. 5) prior to bonding process. The bonding layer 690 can include dielectric materials such as silicon oxide, silicon nitride, silicon oxynitride or any combination thereof. The bonding layer 690 can also include adhesion materials, for example, epoxy resin, polyimide, dry film, photosensitive polymer, etc. The bonding layer 690 can be formed by one or more thin film deposition processes such as CVD, PVD, PECVD, ALD, high-density-plasma CVD (HDP-CVD), sputtering, spin-coating, or any combination thereof.

In some embodiments, after forming the bonding layers 690, the interconnect VIAs 486 and 586 can be formed for the peripheral circuitry 400 and the 3D memory array 500, respectively. The interconnect VIAs 486/586 can include metal or metal alloy such as copper (Cu), tin (Sn), nickel (Ni), gold (Au), silver (Ag), titanium (Ti), aluminum (Al), titanium nitride (TiN), tantalum nitride (TaN), etc., or any combination thereof. The metal or metal alloy of the interconnect VIAs 486/586 can be disposed by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The fabrication process of the interconnect VIAs 486/586 can further include, but not limited to, photolithography, wet/dry etching, planarization (e.g., CMP, or RIE etchback), etc.

In some embodiments, the peripheral circuitry 400 and the 3D memory array 500 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where all the dies/chips on the first substrate 430 with the peripheral circuitry 400 can be joined simultaneously with the second substrate 530 with the 3D memory array 500. Individual 3D memory device 600 can be diced after wafer bonding. On the other hand, bonding at die level can be performed after dicing and die testing, where functional dies of the peripheral circuitry 400 and 3D memory array 500 can be selected first and then bonded to form 3D memory device 600, enabling higher yield of 3D memory device 600.

In some embodiments, during the bonding process, the peripheral interconnect layer 462 can be aligned with the array interconnect layer 562 when the interconnect VIAs 486 of the peripheral circuitry 400 are aligned with corresponding interconnect VIAs 586 of the 3D memory array 500. As a result, corresponding interconnect VIAs 486/586 can be connected at the bonding interface 688 and the 3D memory array 500 can be electrically connected with the peripheral circuitry 400.

In some embodiments, the peripheral circuitry 400 and the 3D memory array 500 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously.

In some embodiments, the peripheral circuitry 400 and the 3D memory array 500 can be bonded by using the bonding layer 690. At the bonding interface 688, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at the bonding interface 688. The treatment process can prepare the surfaces of array interconnect layer 562 and the peripheral interconnect layer 462 so that the surfaces of the insulating layers 562/462 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between the interconnect VIAs 486 and 586. As a result, metallic materials in the corresponding pairs of the interconnect VIAs can be inter-mixed with each other or forming alloy after the bonding process.

After bonding the peripheral and array interconnect layers together, at least one peripheral device of the peripheral circuitry 400 fabricated on the first substrate 430 can be electrically connected with at least one memory cell of the 3D memory array 500 fabricated on the second substrate 530.

FIG. 6 illustrates an embodiment that the 3D memory array 500 can be bonded on top of the peripheral circuitry 400. In some embodiments, the peripheral circuitry 400 can be bonded on top of the 3D memory array 500.

Through bonding, the 3D memory device 600 can function similar to a 3D memory where peripheral circuitry and memory array are fabricated on the same substrate (as shown in FIG. 1). By stacking the 3D memory array 500 and the peripheral circuitry 400 on top of each other, the density of the 3D memory device 600 can be increased. In the meantime, the bandwidth of the 3D memory device 600 can be increased because of the interconnect distance between the peripheral circuitry 400 and the 3D memory array 500 can be reduced by using the stacked design.

Figure 7A:
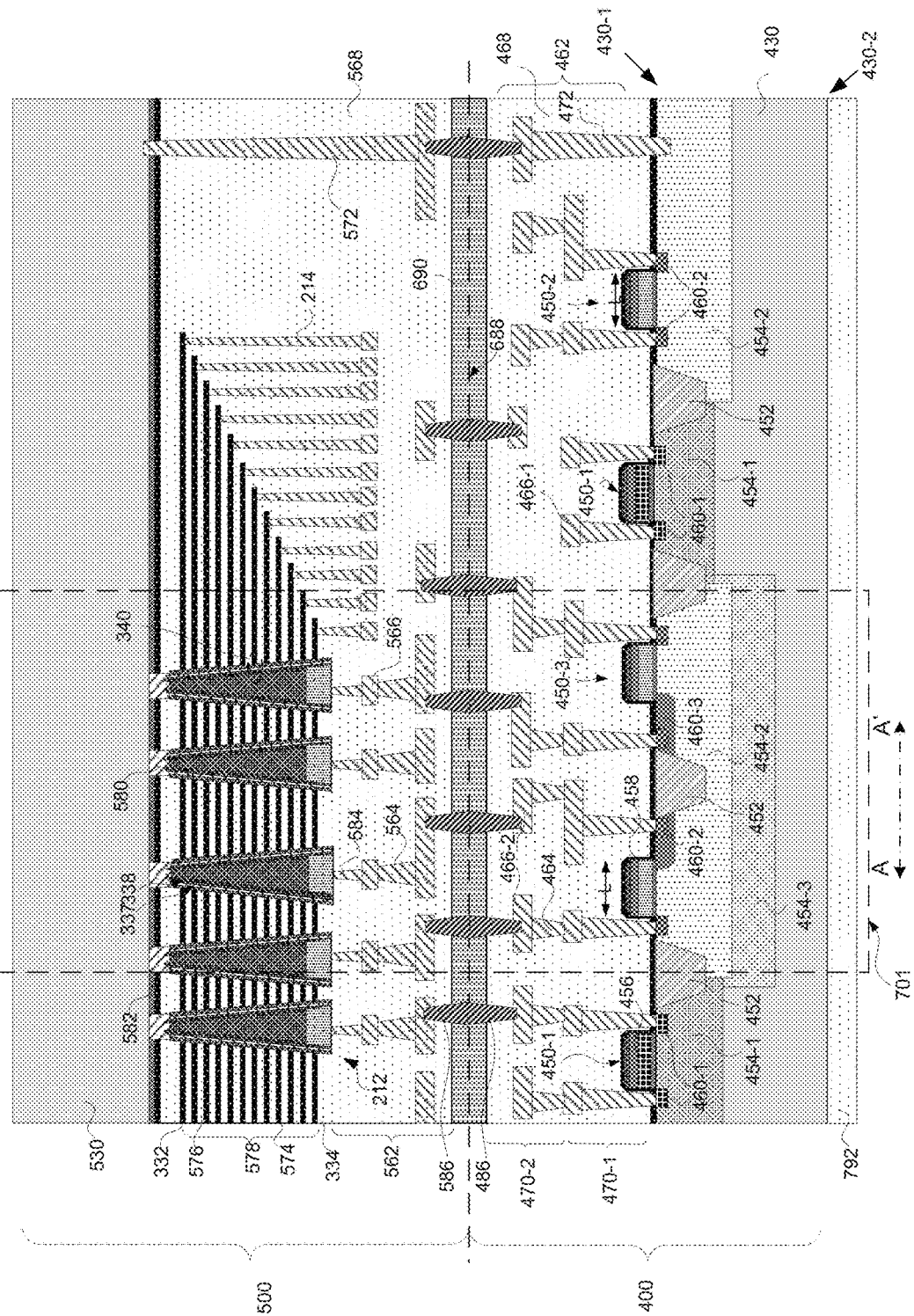
FIGS. 7A and 7B illustrate cross-sectional views of a 3D memory device at certain process stage, according to some embodiments of the present disclosure.

FIG. 7A illustrates a cross-sectional view of a 3D memory device 700, according to some embodiments of the present disclosure. The 3D memory device 700 includes a dielectric capping layer 792 disposed on the second side 430-2 of the first substrate 430 after forming the 3D memory device 600 in FIG. 6.

In some embodiments, the first substrate 430 of the peripheral circuitry 400 can be thinned down from the backside 430-2 (or the second side) after bonding the 3D memory array 500 with the peripheral circuitry 400. In some embodiments, substrate thinning process can include one or more of grinding, dry etching, wet etching, and chemical mechanical polishing (CMP). The thickness of the first substrate 430 after thinning can be in a range between 1 μm to 10 μm.

The dielectric capping layer 792 can be any suitable insulating material, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof. In some embodiments, the dielectric capping layer 792 covers the entire backside 430-2 of the first substrate 430 after deposition.

Figure 7B:
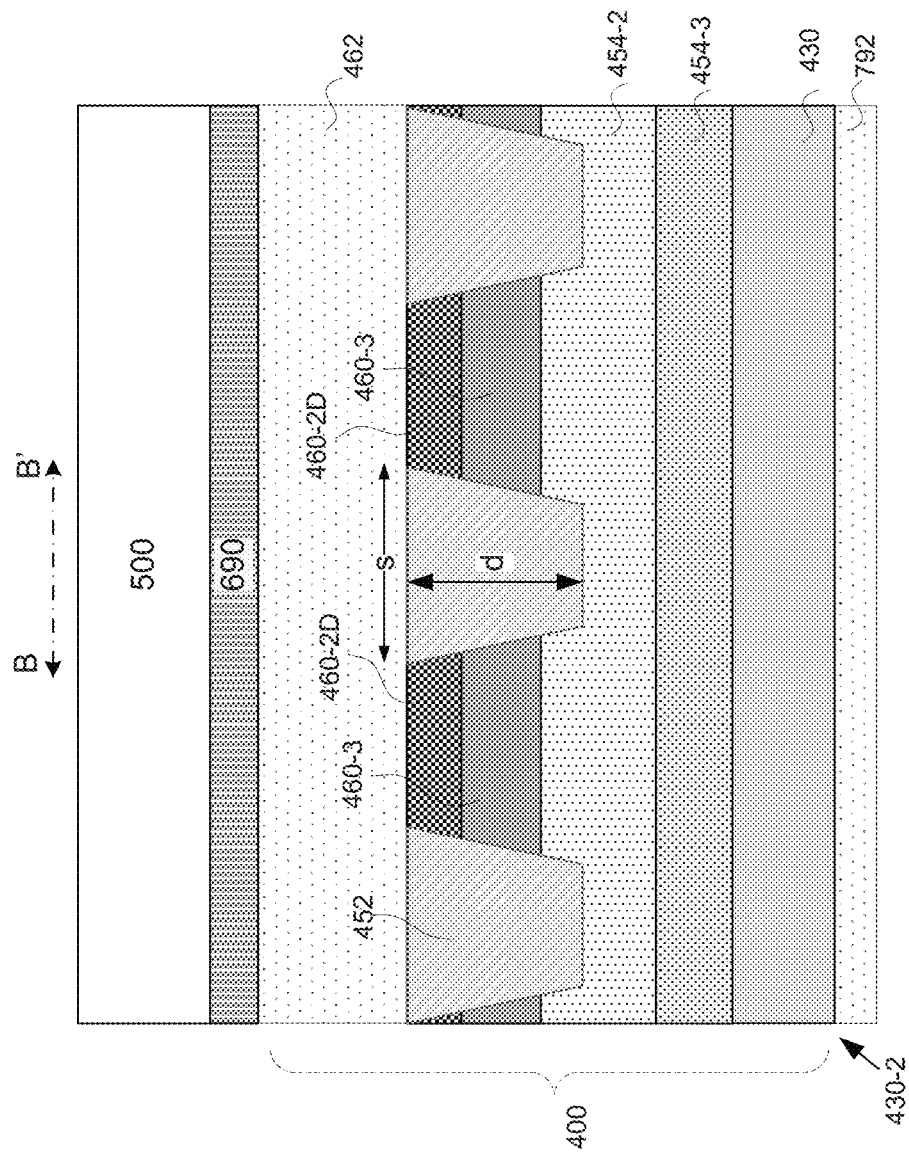

FIG. 7B illustrates a cross-sectional view of a region 701 of the 3D memory device 700 in FIG. 7A, according to some embodiments of the present disclosure. The region 701 corresponds to the peripheral region 401 in FIGS. 4A-4C, having the peripheral devices 450 (e.g., HV NMOS 450-3) with high density. The cross-section of region 701 in FIG. 7A corresponds to a cross-sectional view of the peripheral region 401 along the line AA' after bonding with the 3D memory array 500. The cross-sectional view of region 701 in FIG. 7B corresponds to a cross-section view of the peripheral region 401 along the line BB' after bonding with the 3D memory array 500.

FIGS. 8A and 8B illustrate a top-down and a cross-sectional view of a 3D memory device 801, according to some embodiments of the present disclosure. The 3D memory device 801 includes a plurality of trenches 894 formed in the 3D memory device 700 and the region 701 (in FIGS. 7A and 7B). In the top-down view of FIG. 8A, the memory array 500, the bonding layer 690 and the peripheral interconnect layer 462 are omitted in order to show the underlying materials. The cross-section in FIG. 8B is along the line BB' in FIG. 8A, corresponding to the cross-sections in FIG. 4C and FIG. 7B in previous process stages. Note that in the top-down view of FIG. 8A, the trenches 894 are below the gate stack 456 and STI 452.

In some embodiments, the plurality of trenches 894 of the memory device 801 can be formed from the backside 430-2 of the first substrate 430 after forming the 3D memory device 700 in FIG. 7A (with an enlarged view of region 701 in FIG. 7B). In this example, trench 894 penetrates through the dielectric capping layer 792 and extends into the first substrate 430, exposing a portion of the STI 452 at the bottom of the trenches. In some embodiments, the trench 894 also penetrates the wells 454 (e.g., deep n-well 454-3 and the p-well 454-2). In some embodiments, the width "w" of the trench 894 can be narrower than the spacing "s" between two neighboring drains 460-2D.

The trench 894 can be formed by using photolithography and etching. The etching process can include wet chemical etching, reactive ion etching (RIE), high-aspect ratio plasma etching, or any combination thereof. In some embodiments, the silicon of the first substrate 430 can be etched by alternating plasma etching using $SF_6$ chemistry and protection film deposition using $C_4F_8$ chemistry.

An exemplary layout of the trenches 894 is presented in FIG. 8A. In this example, the trenches 894 run parallel to the line AA', i.e., perpendicular to the gate stack 456 or the line BB'. In the other words, the trenches 894 are formed between the neighboring drains 460-2 from the backside 430-2 of the first substrate 430.

FIGS. 9A and 9B illustrate a top-down and a cross-sectional view of a 3D memory device 901, according to some embodiments of the present disclosure. The 3D memory device 901 includes a plurality of backside-deep-trench-isolations (BDTI) 996 (also referred to as deep-trench-isolation) formed in the 3D memory device 801 in FIGS. 8A and 8B. Note that in the top-down view of FIG. 9A, the memory array 500, the bonding layer 690 and the peripheral interconnect layer 462 are omitted in order to show the underlying materials.

In some embodiments, the BDTI 996 can be formed by disposing a trench insulating layer 995 inside the trench 894 (in FIGS. 8A and 8B), followed by a planarization process. The trench insulating layer 995 can be any suitable insulator, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The trench insulating layer can be deposited by one or more thin film deposition processes such as CVD, PVD, PECVD, ALD, high-density-plasma CVD (HDP-CVD), sputtering, spin-coating, or any combination thereof. In some embodiments, a heat treatment can be implemented after deposition to densify the trench insulating layer 995.

In some embodiments, the BDTI 996 can be coplanar with the dielectric capping layer 792 by using a planarization process such as CMP, RIE, etc.

As the word lines and bit-lines of the memory array become denser in a 3D memory, dimensions of the peripheral devices 450 and spacing between adjacent ones are getting smaller. In the meantime, higher voltages are applied to operate a 3D memory with higher density and larger storage capacity. Accordingly, it is challenging to maintain desirable reliability for the peripheral devices in a 3D memory. For example, good electrical isolation is needed between neighboring drains 460-2 of the HV NMOS 450-3 to prevent punch-through across STI 452. By using BDTI 996, additional electrical isolation can be provided for two neighboring peripheral devices, e.g., HV NMOS 450-3. In some embodiments, BDTI 996 can be formed in a direction parallel to the line AA' from the backside 430-2 of the first substrate 430 (as shown in FIGS. 9A and 9B). In this example, leakage current in a direction parallel to the line BB' can be reduced by STI 452 and BDTI 996, while leakage current in a direction parallel to the line AA' can be reduced by STI 452. In some embodiments, BDTI 996 can also be formed between neighboring peripheral devices, in a direction parallel to the line BB' from the backside 430-2 of the first substrate 430. In this example, leakage current in directions along the lines AA' and BB' can be reduced by STI 452 and BDTI 996. As discussed previously that the trench 894 can penetrate the wells 454, the BDTI 996 can also penetrate the wells 454.

In the above descriptions, the shallow-trench-isolation (STI) 452 can be formed on the first substrate 430 prior to the bonding of the peripheral circuitry 400 with the 3D memory array 500. In this example, the BDTI 996 provides additional electrical isolation, reducing leakage current between neighboring peripheral devices 450 (e.g., HV NMOS 450-3) from underneath the STI 452.

In some embodiments, electrical isolation between neighboring peripheral devices 450 (e.g., HV NMOS 450-3) can be provided by the backside-deep-trench-isolation without STI 452. These embodiments are illustrated in FIGS. 10A-10D, 11A-11B, and 12A-12B.

FIGS. 10A and 10B illustrate a top-down and a cross-sectional view of a 3D memory device 1001, according to some embodiments of the present disclosure. The cross-section of the 3D memory device 1001 in FIG. 10B is along the line BB' in FIG. 10A.

In some embodiments, the 3D memory device 1001 can be a portion of the peripheral circuitry 400, similar to the peripheral region 401 shown in FIG. 4A-4C. The 3D memory device 1001 also includes the first substrate 430, the peripheral devices (e.g., HV NMOS 450-3), and the peripheral interconnect layer 462 (omitted in FIG. 10A). In this example, the STI 452 can be formed between the neighboring peripheral devices 450-3 in a direction parallel to the line BB'. The cross-section of the 3D memory device 1001 along the line AA' is similar to the cross-section of peripheral region 401 in FIG. 4A, and is not repeated herein.

In some embodiments, the wells (e.g., the p-well 454-2, the deep n-well 454-3, etc.), the source and drain (e.g., source 460-2S and drain 460-2D) and the lightly doped drain (LDD) 460-3 of the peripheral device (e.g., HV NMOS 450-3) can also be formed by implantation, followed by activation anneal, similar to the formation of the respective ones in FIGS. 4A-4C.

In some embodiments, the wells (e.g., the p-well 454-2, the deep n-well 454-3, etc.), the source and drain (e.g., source 460-2S and drain 460-2D) and the lightly doped drain (LDD) 460-3 of the peripheral device (e.g., HV NMOS 450-3) can be designed for individual peripheral device 450-3, having patterns shown in FIGS. 10A and 10B.

In some embodiments, the wells (e.g., the p-well 454-2, the deep n-well 454-3, etc.), the source and drain (e.g., source 460-2S and drain 460-2D) and the lightly doped drain (LDD) 460-3 of the peripheral device 450-3 can have patterns designed for a plurality of peripheral devices (e.g., HV NMOS 450-3), having patterns shown in FIGS. 10C and 10D. In this example, the peripheral devices situated in the same active device area (between adjacent STIs 452) can share the same wells, source/drain and LDD. In this example, isolation for the active device area for the peripheral device in the direction parallel to the line AA' is defined by the STIs 452 that extends in the direction parallel to the line BB' or the gate stack 456. Isolation for the active device area for individual peripheral device in the direction parallel to the line BB' is not defined at this stage of processing, and can be defined by backside-deep-trench-isolations in the subsequent processes.

FIGS. 11A and 11B illustrate a top-down and a cross-sectional view of a 3D memory device 1101, according to some embodiments of the present disclosure. The cross-section of the 3D memory device 1101 in FIG. 11B is along the line BB' in FIG. 11A.

In some embodiments, the 3D memory device 1101 includes the 3D memory array 500 (in FIG. 5) bonded on the 3D memory device 1001 (in FIG. 10) using similar methods described previously. In some embodiments, the 3D memory device 1101 also includes the bonding layer 690. Note that in the top-down view of FIG. 11A, the memory array 500, the bonding layer 690 and the peripheral interconnect layer 462 are omitted in order to show the underlying materials.

In some embodiments, the second side or the backside 430-2 of the first substrate 430 can be thinned down after bonding the 3D memory array 500 with the 3D memory device 1001. In some embodiments, the dielectric capping layer 792 can be disposed on the backside 430-2 of the first substrate 430. The processes for substrate thinning and dielectric capping layer deposition are similar to the ones described previously for FIGS. 7A and 7B.

In some embodiments, the 3D memory device 1101 further includes a plurality of trenches 1194. The trench 1194 penetrates through the first substrates 430. In some embodiments, the trench 1194 extends through the wells (e.g., p-well 454-2, the deep n-well 454-3, etc.) and the source/drain 460-2S/460-2D. In some embodiments, a portion of the peripheral interconnect layer 462 can be exposed at the bottom of the trench 1194.

The trench 1194 can be formed using similar processes as the trench 894, which includes photolithography and etching from the backside 430-2 of the first substrate 430. The etching process can include wet chemical etching, reactive ion etching (RIE), high-aspect ratio plasma etching, or any combination thereof. In some embodiments, the silicon of the first substrate 430 can be etched by alternating plasma etching using $SF_6$ chemistry and protection film deposition using $C_4F_8$ chemistry.

An exemplary layout of the trenches 1194 is presented in FIG. 11A. Note that in this top-down view, the trenches 1194 are below the gate stack 456 and STI 452. In this example, the trenches 1194 run parallel to the line AA', i.e., perpendicular to the gate stack 456 or the line BB'. The trenches 1194 can be formed between the neighboring drains 460-2 from the backside 430-2 of the first substrate 430.

FIGS. 12A and 12B illustrate a top-down and a cross-sectional view of a 3D memory device 1201, according to some embodiments of the present disclosure. The cross-section of the 3D memory device 1201 in FIG. 12B is along the line BB' in FIG. 12A. Note that in the top-down view of FIG. 12A, the memory array 500, the bonding layer 690 and the peripheral interconnect layer 462 are omitted in order to show the underlying materials.

In some embodiments, the 3D memory device 1201 includes a plurality of backside-deep-trench-isolations (BDTIs) 1296. The BDTI 1296 can be formed by disposing a trench insulating layer 1295 inside the trenches 1194 of the 3D memory device 1101 in FIGS. 11A and 11B. In some embodiments, the BDTI 1296 can contact the portion of the peripheral interconnect layer 462 exposed inside the trench 1194. The trench insulating layer 1295 can be any suitable insulator, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The trench insulating layer 1295 can be deposited by one or more thin film deposition processes such as CVD, PVD, PECVD, ALD, high-density-plasma CVD (HDP-CVD), sputtering, spin-coating, or any combination thereof. In some embodiments, a heat treatment can be implemented after deposition to densify the trench insulating layer 1295.

In some embodiments, the BDTI 1296 can be coplanar with the dielectric capping layer 792 by using a planarization process such as CMP, RIE, etc.

By using BDTI 1296, electrical isolation can be formed between neighboring peripheral devices, e.g., HV NMOS 450-3. In some embodiments, BDTI 1296 can be formed in a direction parallel to the line AA' from the backside 430-2 of the first substrate 430 (as shown in FIGS. 12A and 12B). In this example, leakage current in a direction parallel to the line BB' can be reduced by BDTI 1296 without relying on shallow-trench-isolations, while leakage current in a direction parallel to the line AA' can be reduced by STI 452.

In some embodiments, BDTI 1296 can also be formed between neighboring peripheral devices, in a direction parallel to the line BB' from the backside 430-2 of the first substrate 430. In this example, leakage current in the directions along the lines AA' and BB' can both be reduced by BDTI 1296 without relying on STI 452.

Patterning small features with high density has been challenging in semiconductor manufacturing. Complicated systems and processes, for example extreme ultraviolet (EUV) lithography and double-patterning, are implemented for critical structures such as shallow-trench-isolations to form active device areas. Therefore, removing STI 452 in some areas, for example between peripheral devices in a direction parallel to the line AA', can reduce process complexity for patterning active device areas with high density and small pitch.

Figure 13:
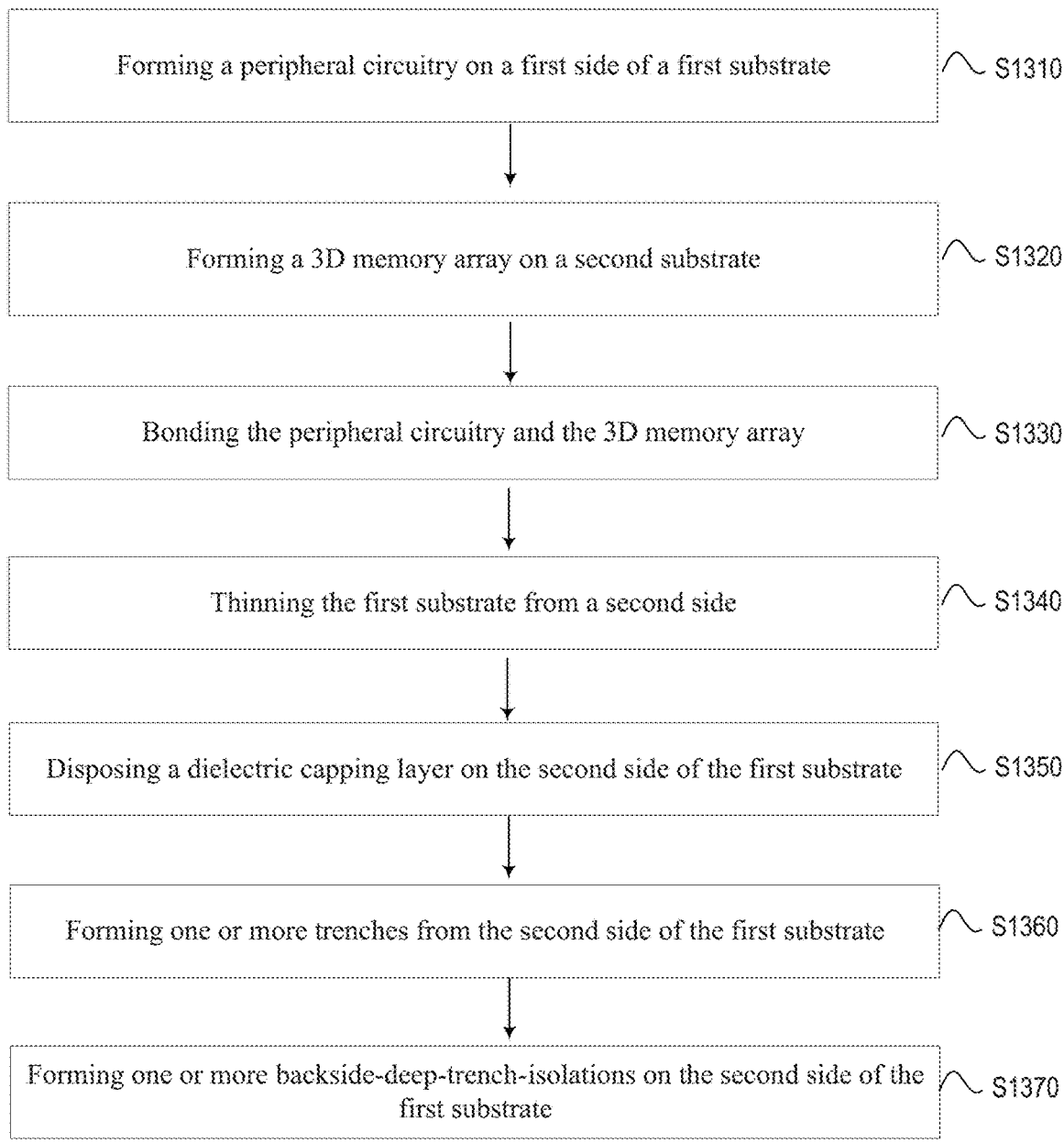
FIG. 13 illustrates a flow diagram of an exemplary method for forming a memory device with a 3D capacitor, according to some embodiments of the present disclosure.

FIG. 13 illustrates an exemplary fabrication process 1300 for forming a backside-deep-trench-isolation for a 3D memory device shown in FIGS. 4A-4C, 5-6, 7A-7B, 8A-8B and 9A-9B, and another 3D memory device shown in FIGS. 10A-10D, 11A-11B and 12A-12B, accordance to some embodiments of the present disclosure. It should be understood that the operations shown in fabrication process 1300 are not exhaustive and that other operations can be performed as well before, after, or between any of the illustrated operations. In some embodiments, some process steps of exemplary fabrication process 1300 can be omitted or include other process steps that are not described here for simplicity. In some embodiments, process steps of fabrication process 1300 can be performed in a different order and/or vary.

As shown in FIG. 13, fabrication process 1300 starts at process step S1310, in which a peripheral circuitry is formed on a first side (e.g., a front side) of a first substrate. In some embodiments, the forming of the peripheral circuitry includes forming one or more peripheral devices and a peripheral interconnect layer. As an example, the peripheral circuitry can be the peripheral circuitry 400 shown in FIG. 4A, including the peripheral device 450 and the peripheral interconnect layer 462. The fabrication process for the peripheral circuitry can be similar to fabrication process for the peripheral circuitry 400.

In some embodiments, STI, such as the STI 452 in FIGS. 4A-4C, 10A and 10C, can be formed between peripheral devices 450. The forming of STI includes, but not limited to, patterning the first side 430-1 of the first substrate 430 using lithography and etching, filling an insulating material and polishing the insulating material to form a coplanar surface. The insulating material for STI 452 can include silicon oxide, silicon oxynitride, TEOS, low-temperature oxide (LTO), high temperature oxide (HTO), silicon nitride, etc. The insulating material for STI 452 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI 452 can also include a high temperature annealing step to densify the disposed insulating material for improved electrical isolation.

In some embodiments, a plurality of peripheral interconnect VIAs can be formed for the peripheral circuitry 400. The peripheral interconnect VIAs can be the interconnect VIAs 486 in FIG. 6, and can be made of similar material. The peripheral interconnect VIAs are formed to make electrical connections for the peripheral circuitry. The fabrication processes for the peripheral interconnect VIA include, lithography, trench formation using wet/dry etching, disposing and filling conductive material inside the trench, and removing excess materials outside the trench by using a planarization process such as CMP.

In some embodiments, a bonding layer can be disposed on the peripheral circuitry. The bonding layer can be the bonding layer 690 in FIG. 6, and can be fabricated using similar techniques.

At process step S1320, a 3D memory array is formed on a second substrate. In some embodiments, the 3D memory array can be the 3D memory array 500 in FIG. 5. The 3D memory array can include a plurality of memory cells and an array interconnect layer, for example, the memory cells 340 and the array interconnect layer 562. In some embodiments, the 3D memory array is a 3D NAND flash memory and can include at least a memory string (e.g., the memory string 212) and a staircase structure.

In some embodiments, fabrication of the 3D memory array 500 can include forming a plurality of dielectric layer pairs (also referred to herein as an "alternating dielectric stack") with a first dielectric layer 576 and a second dielectric layer (not shown in figures) that is different from first dielectric layer 576. In some embodiments, the first dielectric layer can be silicon oxide and the second dielectric layer can be silicon nitride. Alternating dielectric stack can be formed by one or more thin film deposition processes such as CVD, PVD, ALD, sputtering, or any combination thereof.

In some embodiments, fabrication of the 3D memory array 500 can also include forming a staircase structure at an end of the alternating dielectric stack by using multiple etch-trim processes.

In some embodiments, fabrication of the 3D memory array 500 can also include removing the second dielectric layer and replacing with a conductor layer 574 to form an alternating conductor/dielectric stack 578. The replacement of the second dielectric layers with conductor layers 574 can be performed by wet etching the second dielectric layers selective to first dielectric layers 576 and filling the structure with conductor layers 574. The conductor layer 574 includes polysilicon, W, Co, Ti, TiN, Ta, TaN, Al, Ni, silicides, etc., and can be filled by CVD, ALD, etc.

In some embodiments, fabrication of the 3D memory array 500 can further include forming a plurality of memory strings 212 penetrating alternating conductor/dielectric stack 578. In some embodiments, fabrication processes to form memory strings 212 can include forming a channel layer 338 that extends vertically through alternating conductor/dielectric stack 578. In some embodiments, channel layer 338 can be an amorphous silicon layer or a polysilicon layer formed by using a thin film deposition process, such as a CVD, ALD, etc.

In some embodiments, fabrication processes to form memory strings 212 can further include forming a memory film 337 between the channel layer 338 and the plurality of conductor/dielectric layer pairs in alternating conductor/dielectric stack 578. Memory film 337 can be a composite dielectric layer, such as a combination of multiple dielectric layers such as a blocking layer, a storage layer, and a tunneling layer.

The blocking layer can be used for blocking the outflow of the electronic charges. In some embodiments, the blocking layer can be a silicon oxide layer or a combination of silicon oxide/silicon oxynitride/silicon oxide ($SiO_2$—SiON—$SiO_2$) multi-layer stack. In some embodiments, the blocking layer includes high dielectric constant (high-k) dielectrics (e.g., aluminum oxide). In one example, the blocking layer includes a silicon oxide layer formed by In-Situ Steam Generation (ISSG) oxidation after a silicon nitride deposition process.

The storage layer can be used for storing electronic charges. The storage and/or removal of charges in the storage layer can impact the on/off state and/or a conductance of the semiconductor channel. The storage layer can include polycrystalline silicon (polysilicon) or silicon nitride. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes.

The tunneling layer can be used for tunneling electronic charges (electrons or holes). The tunneling layer can be dielectric materials such as silicon oxide, silicon nitride, silicon oxynitride, or any combination thereof. In some embodiments, the tunneling layer can be an oxide layer formed by using a deposition process.

In some embodiments, fabrication of the 3D memory array 500 can further include forming an epitaxial layer 580 at an end of memory string 212. In some embodiments, epitaxial layer 580 can be formed in the second substrate, and correspond to each memory string 212 as an epitaxial plug 580. Epitaxial layer 580 can be implanted to a desired doping level.

In some embodiments, fabrication of the 3D memory array 500 can further include forming multiple word line contacts. As illustrated in FIG. 5, each word line contact structure 214 can extend vertically to form electrical contact to a corresponding conductor layer 574 of the staircase structure, wherein each conductor layer 574 can individually control a memory cell of memory strings 212. In some embodiments, fabrication processes to form word line contact structures 214 include forming a vertical opening through an insulating layer 568 using dry/wet etch process, followed by filling the opening with conductive materials such as W, Co, Cu, Al, doped poly-silicon, silicides, or any combination thereof. The conductive materials can be disposed by ALD, CVD, PVD, plating, sputtering, or any combination thereof.

In some embodiments, fabrication of the 3D memory array 500 can further include forming the array interconnect layer 562, which can electrically connect the memory strings with word lines and bit lines. As shown in FIG. 5, in some embodiments, the array interconnect layer 562 can include one or more contact structures 564 and conductive lines 566 in the insulating layer 568. In some embodiments, fabrication processes to form array interconnect layer 562 include forming the insulating layer 568, followed by forming a plurality of bit line contacts 584 in contact with memory strings 212 in the insulating layer 568. The insulating layer 568 can include one or more layers of dielectric materials such as silicon oxide, silicon nitride, silicon oxynitride, or any combination thereof. The insulating layer 568 can be formed by one or more thin film deposition processes such as CVD, PVD, PECVD, ALD, high-density-plasma CVD (HDP-CVD), sputtering, spin-coating, or any combination thereof. Bit line contacts 584 can be formed by forming openings in the insulating layer 568, followed by filling the openings with conductive materials such as W, Co, Cu, Al, Ti, TiN, Ta, TaN, doped silicon, silicides, or any combination thereof, deposited by CVD, PVD, sputtering, evaporating, plating, or any combination thereof.

In some embodiments, fabrication processes to form array interconnect layer 562 further include forming one or more conductive lines 566 and one or more contact structures 564 in the insulating layer 568. Conductor layers and contact layers can include conductor materials such as W, Co, Cu, Al, Ti, Ta, TiN, TaN, doped silicon, silicides, or any combination thereof. Conductor layers and contact layers can be formed by any suitable known BEOL methods.

In some embodiments, other structures can also be formed on the 3D memory array, for example, a bonding layer, a plurality of interconnect VIAs and a substrate contact, which are illustrated in FIGS. 5 and 6, as the bonding layer 690, the interconnect VIAs 586 and the substrate contact 572.

In some embodiments, the bonding layer 690 can be disposed on the 3D memory array 500 after completing the array interconnect layer 562. The bonding layer 690 can include dielectric materials such as silicon oxide, silicon nitride, silicon oxynitride or any combination thereof. The bonding layer 690 can also include adhesion materials, for example, epoxy resin, polyimide, dry film, photosensitive polymer, etc. The bonding layer 690 can be formed by one or more thin film deposition processes such as CVD, PVD, PECVD, ALD, high-density-plasma CVD (HDP-CVD), sputtering, spin-coating, or any combination thereof.

In some embodiments, the interconnect VIAs 586 can be formed in the array interconnect layer 562, electrically connected with one or more of the conductive lines 566 and/or the contact structures 564 on the 3D memory array 500. The fabrication process of the interconnect VIA 586 can be similar to the interconnect VIA 486.

At process step S1330, the peripheral circuitry can be bonded with the 3D memory array to form a 3D memory device, wherein the 3D memory device can be the 3D memory device 600 in FIG. 6.

In some embodiments, the peripheral circuitry 400 and the 3D memory array 500 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where all the dies/chips on the first substrate with the peripheral circuitry 400 can be joined simultaneously with the second substrate with the 3D memory array 500. Individual 3D memory device 600 can be diced after wafer bonding. On the other hand, bonding at die level can be performed after dicing and die test, where functional dies of the peripheral circuitry 400 and 3D memory array 500 can be selected first and then bonded to form 3D memory device 600, enabling higher yield of 3D memory device 600.

In some embodiments, the 3D memory array 500 can be flipped upside down and positioned above the peripheral circuitry (or vice versa). The array interconnect layer 562 of the 3D memory array 500 can be aligned with the peripheral interconnect layer 462 of the peripheral circuitry 400.

In some embodiments, aligning the array interconnect layer 562 with peripheral interconnect layer 462 is performed by aligning interconnect VIAs 586 of the 3D memory array 500 with corresponding interconnect VIAs 486 of the peripheral circuitry 400. As a result, corresponding interconnect VIAs can be connected at a bonding interface 688 and the 3D memory array 500 can be electrically connected with the peripheral circuitry 400.

In some embodiments, the peripheral circuitry 400 and the 3D memory array 500 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously. As illustrated in FIG. 6, the 3D memory array 500 can be joined with the peripheral circuitry 400, thereby forming the bonding interface 688.

In some embodiments, a bonding layer can be formed on the peripheral circuitry 400 and/or 3D memory array 500 prior to hybrid bonding. At the bonding interface 688, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at the bonding interface 688. The treatment process can prepare the surfaces of array interconnect layer 562 and the peripheral interconnect layer 462 so that the surfaces of the insulating layers 568/468 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between the interconnect VIAs 586 and 486. As a result, metallic materials in the corresponding pairs of the interconnect VIAs can be inter-mixed with each other or forming alloy after the bonding process.

At process step S1340, the first substrate can be thinned after bonding. The thinning process can be performed from a second side (or backside) of the first substrate, wherein the second side of the first substrate is opposite the first side, further away from the peripheral devices.

In some embodiments, a handle wafer (e.g., glass, plastic, or silicon) can be attached to the second substrate prior to the thinning process. In some embodiments, substrate thinning process can include one or more of grinding, dry etching, wet etching, and chemical mechanical polishing (CMP).

At process step S1350, a dielectric capping layer can be deposited on the second side of the first substrate. The dielectric capping layer can be the dielectric capping layer 792 in FIGS. 7A-7B and FIGS. 11A-11B, and can be made from similar material using similar process.

At process step S1360, one or more trenches (e.g., trenches 894 in FIGS. 8A-8B and trenches 1194 in FIGS. 11A-11B) are formed from the second side of the first substrate. The trenches penetrate through the dielectric capping layer and extend into the first substrate. In some embodiments, the trenches 894 expose a portion of the STI 452 of the peripheral circuitry 400 (as in FIGS. 8A-8B). In some embodiments, the trenches 1194 exposes a portion of the peripheral interconnect layer 462 of the peripheral circuitry 400 (as in FIGS. 11A-11B).

In some embodiments, The trench 894/1194 can be formed using photolithography and etching from the backside 430-2 of the first substrate 430. The etching process can include wet chemical etching, reactive ion etching (RIE), high-aspect ratio plasma etching, or any combination thereof. In some embodiments, the silicon of the first substrate 430 can be etched by alternating plasma etching using $SF_6$ chemistry and protection film deposition using $C_4F_8$ chemistry.

At process step S1370, one or more backside-deep-trench-isolations (BDTIs), for example BDTI 996 in FIGS. 9A-9B and BDTI 1296 in FIGS. 12A-12B, can be formed after depositing a trench insulating layer inside the trenches 894/1294. The trench insulating layer (e.g., the trench insulating layer 995 in FIGS. 9A-9B and the trench insulating layer 1295 in FIGS. 12A-12B) can be any suitable insulator, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The trench insulating layer 995/1295 can be deposited by one or more thin film deposition processes such as CVD, PVD, PECVD, ALD, high-density-plasma CVD (HDP-CVD), sputtering, spin-coating, or any combination thereof. In some embodiments, a heat treatment can be implemented after deposition to densify the trench insulating layer 995/1295.

In some embodiment, the BDTIs can be coplanar with the dielectric capping layer 792 on the second side of the first substrate. In some embodiments, the excessive the trench insulating layer 995/1295 outside the trenches 894/1194 can be removed by using a planarization process, for example, chemical mechanical polishing, reactive ion etching, etc.

In summary, the present disclosure describes various embodiments of a backside-deep-trench-isolation for a memory device and methods of making the same.

In some embodiments, a three-dimensional (3D) memory device includes a peripheral circuitry formed on a first substrate. The peripheral circuitry includes a plurality of peripheral devices on a first side of the first substrate, a first interconnect layer disposed on the plurality of peripheral devices, and a deep-trench-isolation on a second side of the first substrate, wherein the first and second sides are opposite sides of the first substrate and the deep-trench-isolation is configured to provide electrical isolation between at least two neighboring peripheral devices. The 3D memory device also includes a memory array formed on a second substrate. The memory array includes at least one memory cell and a second interconnect layer disposed on the at least one memory cell, wherein the second interconnect layer of the memory array is bonded with the first interconnect layer of the peripheral circuitry, and at least one of the plurality of peripheral devices is electrically connected with the at least one memory cell.

In some embodiments, a method for forming a three-dimensional (3D) memory device includes forming, on a first side of a first substrate, peripheral circuitry having a plurality of peripheral devices and a first interconnect layer. The method also includes forming, on a second substrate, a memory array having a plurality of memory cells and a second interconnect layer. The method further includes bonding the first interconnect layer of the peripheral circuitry with the second interconnect layer of the memory array, such that at least one of the peripheral devices of the peripheral circuitry is electrically connected with at least one of the memory cells of the memory array. The method also includes forming one or more deep-trench-isolations on a second side of the first substrate, wherein the first and second sides are opposite sides of the first substrate, and the one or more deep-trench-isolations are configured to provide electrical isolation between at least two neighboring peripheral devices.

In some embodiments, a method for forming a three-dimensional (3D) memory device includes forming, on a first side of a first substrate, peripheral circuitry having a plurality of peripheral devices, a first interconnect layer, and one or more shallow-trench-isolations. The method also includes forming, on a second substrate, a memory array having a plurality of memory cells and a second interconnect layer. The method further includes bonding the first interconnect layer of the peripheral circuitry with the second interconnect layer of the memory array, such that at least one of the peripheral devices of the peripheral circuitry is electrically connected with at least one of the memory cells of the memory array. The method also includes forming one or more deep-trench-isolations on a second side of the first substrate, wherein the first and second sides are opposite sides of the first substrate and the one or more deep-trench-isolations are configured to provide electrical isolation for at least one of the peripheral devices.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming, on a first side of a first substrate, a peripheral circuitry comprising peripheral devices and a first interconnect layer, wherein each peripheral device of the peripheral devices is formed within a well in the first substrate;
    forming shallow-trench-isolations extending into the first substrate from the first side;
    forming, on a second substrate, a memory array comprising memory cells and a second interconnect layer;
    bonding the first interconnect layer of the peripheral circuitry with the second interconnect layer of the memory array using a bonding layer, such that at least one of the peripheral devices of the peripheral circuitry is electrically connected with at least one of the memory cells of the memory array; and
    forming deep-trench-isolations extending into the first substrate and the well of the peripheral device from a second side of the first substrate wherein the deep-trench-isolations contact the first interconnect layer between source regions of neighboring peripheral devices and drain regions of the neighboring peripheral devices, wherein the first and second sides are opposite sides of the first substrate, and the deep-trench-isolations are configured to provide electrical isolation between at least two of the neighboring peripheral devices.

2. The method of claim 1, wherein the forming of the peripheral circuitry further comprises forming the well in the first substrate from the first side.

3. The method of claim 2, wherein the shallow-trench-isolations are shallower than the well.

4. The method of claim 1, wherein the forming of the peripheral circuitry further comprises forming a gate stack of the peripheral devices that extends laterally in a first direction parallel to the first substrate.

5. The method of claim 4, wherein the forming of the deep-trench-isolations comprises:
    forming trenches from the second side of the first substrate; and
    disposing a trench insulating layer inside the trenches.

6. The method of claim 5, wherein the forming of the trenches comprises etching through the first substrate from the second side to expose a portion of the first interconnect layer in a second direction parallel to the first substrate, wherein the second direction is perpendicular to the first direction.

7. The method of claim 5, further comprising:
    removing a portion of the trench insulating layer located outside the trenches.

8. The method of claim 7, wherein the removing the portion of the trench insulating layer outside the trenches comprises planarizing the second side of the first substrate with chemical mechanical polishing.

9. The method of claim 5, wherein the forming of the trenches further comprises etching through the well from the second side of the first substrate.

10. The method of claim 5, wherein the disposing of the trench insulating layer comprises disposing, inside the trenches, silicon oxide, silicon nitride, silicon oxynitride, tetraethoxysilane (TEOS), polyimide, spin-on-glass (SOG), a low-k dielectric material, or a combination thereof.

11. The method of claim 5, wherein the disposing of the trench insulating layer comprises disposing by chemical vapor deposition (CVD), physical vapor deposition (PVD), plasma-enhanced CVD (PECVD), high density plasma (HDP) CVD, atomic layer deposition (ALD), sputtering, spin-coating, or any combination thereof.

12. The method of claim 1, further comprising:
    thinning the first substrate from the second side after bonding the first interconnect layer and the second interconnect layer.

13. The method of claim 1, further comprising:
    prior to forming the deep-trench-isolations, disposing a dielectric capping layer on the second side of the first substrate.

14. The method of claim 1, wherein the bonding of the first interconnect layer of the peripheral circuitry with the second interconnect layer of the memory array comprises dielectric-to-dielectric bonding and metal-to-metal bonding.

15. The method of claim 1, wherein the forming of the memory array on the second substrate comprises forming a three-dimensional NAND flash memory array.

16. The method of claim 15, wherein the forming of the three-dimensional NAND flash memory array comprises forming a film stack of conductor layers and dielectric layers alternatingly stacked on the second substrate.

17. The method of claim 16, wherein the forming of the three-dimensional NAND flash memory array further comprises forming memory strings penetrating through the film stack, each memory string comprising vertically stacked memory cells.

18. A method for forming a three-dimensional (3D) memory device, comprising:
    forming, on a first side of a first substrate, a peripheral circuitry comprising peripheral devices and a first interconnect layer;
    forming shallow-trench-isolations extending into the first substrate from the first side;
    forming, on a second substrate, a memory array comprising memory cells and a second interconnect layer;
    bonding the first interconnect layer of the peripheral circuitry with the second interconnect layer of the memory array using a bonding layer, such that at least one of the peripheral devices of the peripheral circuitry is electrically connected with at least one of the memory cells of the memory array; and
    forming deep-trench-isolations extending into the first substrate and a well of the peripheral device from a second side of the first substrate wherein the deep-trench isolations contact the shallow-trench-isolations between source regions of neighboring peripheral devices and drain regions of the neighboring peripheral devices, wherein the first and second sides are opposite sides of the first substrate, and the deep-trench-isolations are configured to provide electrical isolation between at least two of the neighboring peripheral devices.

19. The method of claim 18, wherein:

the forming of the deep-trench-isolations comprises:

forming trenches by etching through the first substrate from the second side to expose a portion of the shallow-trench-isolations in a second direction parallel to the first substrate, wherein the second direction is perpendicular to the first direction; and disposing a trench insulating material inside the trenches.

20. The method of claim 19, wherein, in the second direction, the trenches comprise a first width narrower than a second width of the shallow-trench-isolations.

* * * * *

UNITED STATES PATENT AND TRADEMARK OFFICE
CERTIFICATE OF CORRECTION

PATENT NO. : 12,255,164 B2
APPLICATION NO. : 17/850276
DATED : March 18, 2025
INVENTOR(S) : Chen et al.

Page 1 of 1

It is certified that error appears in the above-identified patent and that said Letters Patent is hereby corrected as shown below:

In the Claims

In Column 30, Claim 7, Line 4, delete "comprising:" and insert --comprising--.

In Column 30, Claim 12, Line 25, delete "comprising:" and insert --comprising--.

In Column 30, Claim 13, Line 29, delete "comprising:" and insert --comprising,--.

In Column 31, Claim 19, Line 8, delete "claim 18, wherein:" and insert --claim 5, wherein--.

Signed and Sealed this
Twenty-seventh Day of May, 2025

Coke Morgan Stewart
*Acting Director of the United States Patent and Trademark Office*